United States Patent
Suzuki et al.

(10) Patent No.: US 6,558,988 B1
(45) Date of Patent: May 6, 2003

(54) METHOD FOR MANUFACTURING CRYSTALLINE SEMICONDUCTOR THIN FILM AND THIN FILM TRANSISTOR

(75) Inventors: Koji Suzuki, Kanagawa-ken (JP); Masato Hiramatsu, Tokyo (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/671,173

(22) Filed: Sep. 28, 2000

(30) Foreign Application Priority Data

Sep. 29, 1999 (JP) .............................. 11-277459

(51) Int. Cl.[7] .............................................. H01L 21/00

(52) U.S. Cl. ....................... 438/150; 438/162

(58) Field of Search ................................ 438/151, 153, 438/152, 150, 69, 116, 158, 161–167; 257/59, 64, 66, 70

(56) References Cited

U.S. PATENT DOCUMENTS

| | | | |
|---|---|---|---|
| 6,117,752 A | | 9/2000 | Suzuki |
| 6,232,142 B1 | * | 5/2001 | Yasukawa .................... 438/69 |
| 6,307,214 B1 | * | 10/2001 | Ohtani et al. ................. 257/59 |

FOREIGN PATENT DOCUMENTS

| | | | |
|---|---|---|---|
| JP | 05013327 A | * 1/1993 | ........... H01L/21/20 |
| JP | 11-8196 | 1/1999 | |

OTHER PUBLICATIONS

Qu et al., The effect of amorphous silicon on the epitaxial growth of CoSi2 by Co/Si/Ti/Si solid state epitay, 264–267, IEEE 1998.*

Kim et al, "A New Metal Induced Lateral Crystallization Process for High Performance Low Temperature Poly–Si TFT's", Digest of Technical Papers, p. 187–190, 1997.

Yamamoto et al, "On the Mechanisms of Lateral Solid Phase Epitaxial Growth of Amorphous Si Films Evaporated on $SiO_2$ Patterns", Japanese Journal of Applied Physics, p. 411–415, 1985.

* cited by examiner

Primary Examiner—Olik Chaudhuri
Assistant Examiner—Brook Kebede
(74) Attorney, Agent, or Firm—Oblon, Spivak, McClelland, Maier & Neustadt, P.C.

(57) ABSTRACT

The present invention provides a method for manufacturing a crystalline semiconductor thin film and is characterized in that it includes forming an amorphous semiconductor thin film on an insulated substrate, providing a single crystal semiconductor substrate primarily composed of the same material as that of the amorphous semiconductor thin film, including a catalytic metal on the surface thereof, putting the surface of the single crystal semiconductor substrate into contact with the amorphous semiconductor thin film, and performing a thermal process on the single crystal semiconductor substrate and amorphous semiconductor thin film in contact with each other at a temperature lower than the natural crystallizing temperature of the amorphous semiconductor thin film to crystallize the amorphous semiconductor thin film. With the present invention, a Si crystalline thin film having excellent crystal orientation is formed on an insulated substrate, and a TFT which is excellent in characteristics such as mobility is formed using such a Si crystalline thin film.

27 Claims, 29 Drawing Sheets

METHOD FOR MANUFACTURING CRYSTALLINE SEMICONDUCTOR THIN FILM AND THIN FILM TRANSISTOR

BACKGROUND OF THE INVENTION

1. Field of the Invention

The present invention relates to a crystalline semiconductor thin film, a method for manufacturing the same, a thin film transistor and a method for manufacturing the same.

2. Discussion of the Background

Liquid crystal displays are characterized by their small thicknesses and light weights, capability of being driven at a low voltage, ease of color display, etc. Recently, they are being used as displays of personal computers, word processors and the like. In particular, so-called active matrix liquid crystal displays having a thin film transistor (TFT) as a switching element at each pixel provide a display system, which is presently most suitable for full color televisions and displays for office automation. The reason is that they are not subject to any reduction in contrast, response and the like, even when they have a great number of pixels, and that they are capable of display in halftones.

Such an active matrix liquid crystal display has a substrate configuration formed by two flat glass substrates, i.e., an array substrate and a counter substrate, and a liquid crystal layer sandwiched by the substrates. A color filter and a transparent electrode (counter electrode) associated with each pixel are formed on one of the glass substrates (counter substrate). Pixel electrodes constituted by transparent electrodes and TFTs connected to respective pixel electrodes at the source electrodes thereof are provided on the other glass substrate (array substrate). The gate electrodes of the TFTs are connected to address lines, and their drain electrodes are connected to data lines provided in a direction perpendicular to the address lines.

Address signals are applied to the address lines, and data signals are applied to the data lines. A data signal can be applied to each pixel electrode by applying an address signal at predetermined timing.

The orientation or light transmittance of the liquid crystal layer can be controlled by a potential difference between the counter electrode and pixel electrode, which makes it possible to present any desired display. Details of such liquid crystal displays are described in an article by T. P. Brody et al. (IEEE Trans. on Electron. Devices, Vol. ED-20, November, 1973, pp. 995–1001).

Amorphous Si, polycrystalline Si, etc have been used as semiconductor materials for TFTs. In an active matrix liquid crystal display utilizing polycrystalline Si, drive circuits for applying drive signals to the gate lines and data lines can be formed on the same substrate. This is advantageous in that the display panel can be made compact and in that high reliability of wiring connections can be achieved. The use of such built-in drive circuits makes it possible not only to cause a TFT active matrix liquid crystal display to perform a simple display function as a display but also to turn it into a high performance display having various input/output functions, arithmetic functions, image processing functions and the like.

The characteristics of a built-in drive circuit significantly depend on the characteristics of TFTs. The speed and performance of a circuit becomes higher, the higher the performance of the TFTs.

FIG. 27 is a plan view of a conventional polycrystalline Si thin film showing a top surface thereof. FIG. 28 is a sectional view taken along the line a–a' in FIG. 27. A polycrystalline Si thin film 283 is formed on an insulated circuit 281 with an insulation film 282 made of $SiO_2$ or the like interposed therebetween. A glass substrate is primarily used as the insulated substrate 281. The polycrystalline Si thin film 283 is formed by microscopic crystalline regions 271 referred to as "crystal grains". Since each of the crystalline regions 271 has a different crystal orientation, a grain boundary 272 which is a surface of discontinuity of crystals is formed between grains.

Methods for manufacturing the polycrystalline Si thin film 283 include a method in which an amorphous Si thin film is crystallized in a solid phase through a thermal process and a method in which such a thin film is irradiated with an excimer laser to be melted and crystallized.

However, a TFT utilizing a polycrystalline Si thin film has mobility lower than that of a MOSFET which is formed directly on a single crystal Si substrate and therefore provides circuit performance lower than that of a circuit utilizing a MOSFET.

The reason is that polycrystalline Si is formed by an aggregation of small crystal grains unlike a single crystal. Polycrystalline Si has no crystal continuity at each grain boundary where crystal grains are contiguous to each other. Therefore, although it has solid state properties similar to those of single crystal Si in each of the crystal grains, it includes many defects as a polycrystalline film. A polycrystalline Si thin film has defects at grain boundaries because the orientation of Si in each Si crystal grain is not controlled and the crystal orientation of each crystal grain is different.

This has resulted in a problem in that a TFT formed using a polycrystalline Si thin film has low mobility. There has been another problem in that the characteristic of a transition from an off state to an on state, i.e., slope characteristic (S factor) is not so steep.

One method for providing a Si thin film having excellent crystallinity is shown in FIG. 29.

First, an insulation thin film 292 made of $SiO_2$ or the like is formed on a single crystal Si substrate 291 and is provided with holes 293 in part thereof, and an amorphous Si thin film 294 is then formed. Thereafter, a thermal process is performed to promote crystallization from the regions of the amorphous Si thin film 294 in contact with the single crystal Si substrate 291 in the holes 293 which serve as nuclei.

Although this method provides excellent crystallinity, it can not be applied to liquid crystal displays, image sensors and the like in which the substrate must be translucent because a thin film is formed on a single crystal Si substrate 291. Further, presently available single crystal Si substrate can not be used in electronic apparatuses with a large area because the maximum size of them is on the order of 8 inches (200 mm) in terms of the longer span thereof.

Another method for providing a single crystal Si thin film is to bond a single crystal Si substrate directly on to a quartz substrate and to thin the single crystal Si substrate by polishing and etching the same. However, it is quite difficult to form a single crystal Si substrate with a uniform thickness on the order of 100 nm using this method. It has another problem in that device characteristics can be adversely effected by non-uniformity of characteristics at the bonding interface.

As described above, conventional Si semiconductor thin films formed on an insulated substrate have had a problem in that they provide TFT characteristics significantly lower than those of MOSFETs made of single crystal Si because of the use of amorphous Si or polycrystalline Si.

In the case of the method in which an insulation film having holes are formed on a single crystal Si substrate and an amorphous Si thin film formed on the same is crystallized, problems have arisen in that translucence can not be achieved and in that a thin film with a large area can not be obtained.

In the case of the method in which single crystal Si is bonded on to an insulated substrate and is thinned down, problems have arisen in that the bonding to the substrate can be non-uniform and unstable and in that it is quite difficult to achieve, for example, a desired Si film thickness with high accuracy and uniformity when the Si substrate is etched after the bonding.

As described above, presently available TFTs have problems with characteristics such as mobility, and it has been difficult to provide high speed circuits, high precision analog circuits and the like when they are used in liquid crystal displays and the like.

SUMMARY OF THE INVENTION

The above disadvantages of conventional systems may be overcome, and other objects may also be accomplished with the present invention, the first embodiment of which provides a method for manufacturing a semiconductor thin film, which includes:

preparing a single crystal semiconductor substrate, said single crystal semiconductor substrate including:
at least one catalytic metal on a surface thereof; and
a semiconductor element;

forming a non-crystalline semiconductor thin film on a second substrate, said non-crystalline semiconductor thin film including said semiconductor element;

touching said surface of said single crystal semiconductor substrate to said semiconductor thin film; and crystallizing said semiconductor thin film at a temperature lower than an inherent crystallizing temperature of a pure semiconductor layer that includes said semiconductor element.

Another embodiment of the present invention provides a method for manufacturing a semiconductor thin film, which includes:

preparing a single crystal semiconductor substrate, said single crystal semiconductor substrate including:
at least one catalytic metal on a surface thereof; and
a semiconductor element;

forming a non-crystalline semiconductor thin film on a second substrate, said non-crystalline semiconductor thin film including said semiconductor element;

touching said surface of said single crystal semiconductor substrate to said semiconductor thin film; and crystallizing said semiconductor thin film by low temperature solid state epitaxy.

Another embodiment of the invention provides a method for manufacturing a semiconductor thin film, the method including:

preparing a single crystal semiconductor substrate, said single crystal semiconductor substrate including:
at least one catalytic metal on a surface thereof; and
a semiconductor element;

forming a non-crystalline semiconductor thin film on a second substrate, said non-crystalline semiconductor thin film including said semiconductor element;

touching said surface of said single crystal semiconductor substrate to said semiconductor thin film; and crystallizing said semiconductor thin film; wherein after said crystallizing, said semiconductor thin film has a deviation between crystal orientations of adjoining crystallized regions of less than 5 degrees.

Another embodiment of the invention provides a method for manufacturing a semiconductor thin film, the method including:

preparing a single crystal semiconductor substrate, said single crystal semiconductor substrate including:
at least one catalytic metal on a surface thereof; and
a semiconductor element;

forming a non-crystalline semiconductor thin film on a second substrate, said non-crystalline semiconductor thin film including said semiconductor element;

touching said surface of said single crystal semiconductor substrate to said semiconductor thin film, said semiconductor thin film having a larger area than said surface of said single crystal semiconductor substrate;

touching said surface of said single crystal semiconductor substrate to said semiconductor thin film; and crystallizing said semiconductor thin film at a temperature lower than an inherent crystallizing temperature of a pure semiconductor layer that includes said semiconductor element.

Another embodiment of the invention provides a method for manufacturing a semiconductor thin film transistor including a channel, a gate, a source and a drain, the method including:

preparing a single crystal semiconductor substrate, said single crystal semiconductor substrate including:
at least one catalytic metal on a surface thereof; and
a semiconductor element;

forming a non-crystalline semiconductor thin film on a second substrate, said non-crystalline semiconductor thin film including said semiconductor element;

touching said surface of said single crystal semiconductor substrate to said semiconductor thin film;

crystallizing said semiconductor thin film at a temperature lower than an inherent crystallizing temperature of a pure semiconductor layer that includes said semiconductor element; and patterning said semiconductor thin film for said channel.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
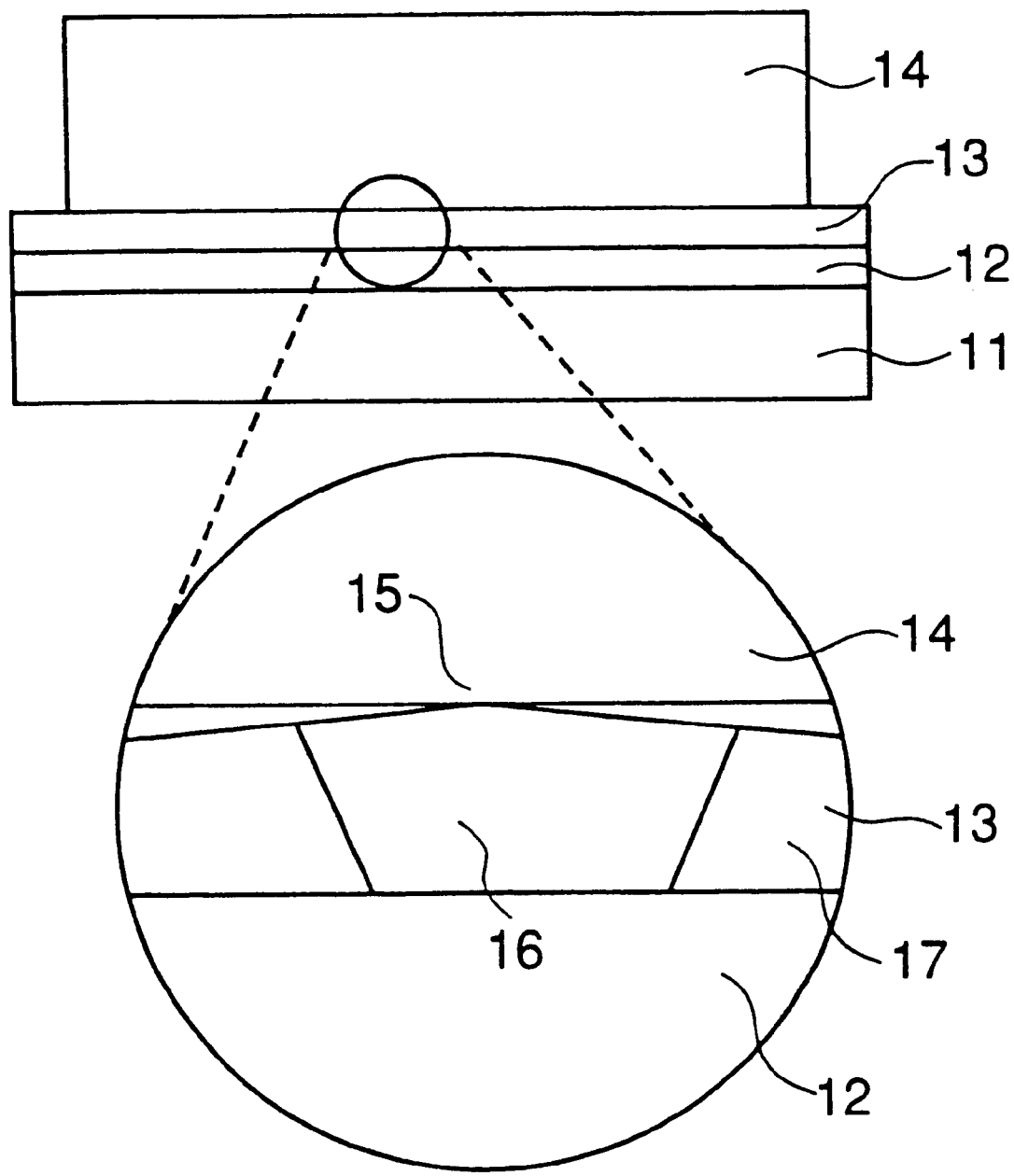
FIG. 1 illustrates a method for forming a crystalline semiconductor thin film according to a first embodiment of the invention.

Various other objects, features and attendant advantages of the present invention will be more filly appreciated as the same becomes better understood from the following detailed description of the preferred embodiments of the invention.

According to a preferred embodiment of the invention, a Si crystalline thin film having excellent crystal orientation is formed on an insulated substrate such as a glass substrate.

The use of such a Si crystalline thin film makes it possible, for example, to improve the mobility of a TFT, to control a threshold voltage and to achieve a steep transition between on and off currents.

Another preferred embodiment of the present invention provides a method for manufacturing a semiconductor thin film, the method includes: preparing a single crystal semiconductor substrate including a semiconductor element and having a catalytic metal at least on a surface; forming a non-crystalline semiconductor thin film including said semiconductor element on a substrate; touching said surface of said single crystal semiconductor substrate to said semiconductor thin film; and crystallizing said semiconductor thin film at a lower temperature than an inherent crystallizing temperature of a pure semiconductor layer including said semiconductor element.

Preferably, the non-crystalline semiconductor thin film may be an amorphous semiconductor layer.

Preferably, the catalytic metal may be selected from a group including Ni, Co, Au, Pd, Cu and Fe. Mixtures are also possible.

Preferably, substantially all of said non-crystalline semiconductor thin film may be changed to a poly-crystalline semiconductor thin film having the similar direction of crystal planes.

Preferably, the semiconductor element may be selected from a group including Si, Ge and Te. Mixtures are possible.

Preferably, the crystallizing temperature may be greater than 400 degrees centigrade. More preferably, the temperature is greater than 450 degrees centigrade, more particularly preferably more than 475 degrees centigrade, more especially preferably more than 500 degrees centigrade, and most preferably more than 550 degrees centigrade.

Preferably, the single crystal semiconductor substrate may have {100}-crystal plane or {110}-crystal plane on said surface.

Preferably, the method for manufacturing a semiconductor thin film may further include: detaching said single crystal semiconductor substrate from said semiconductor thin film; and heating said semiconductor thin film at a higher temperature than said crystallizing temperature.

Preferably, the single crystal semiconductor substrate may have periodic portions containing said catalytic metal on said surface.

Preferably, the method for manufacturing a semiconductor thin film may further include: discharging hydrogen in said non-crystalline semiconductor thin film before said touching.

Preferably, the single crystal semiconductor substrate may have one or more protuberances on said surface.

Preferably, the single crystal semiconductor substrate may have one or more periodic protuberances on said surface.

Preferably, the surface of said single crystal semiconductor substrate may be round in shape.

Another preferred embodiment of the present invention provides a method for manufacturing a semiconductor thin film, the method including: preparing a single crystal semiconductor substrate including a semiconductor element and having a catalytic metal at least on a surface; forming a non-crystalline semiconductor thin film including said semiconductor element on a substrate; touching said surface of said single crystal semiconductor substrate to said semiconductor thin film; and crystallizing said semiconductor thin film by a low temperature solid state epitaxy.

Another preferred embodiment of the present invention provides a method for manufacturing a semiconductor thin film, the method including: preparing a single crystal semiconductor substrate including a semiconductor element and having a catalytic metal at least on a surface; forming a non-crystalline semiconductor thin film including said semiconductor element on a substrate; touching said surface of said single crystal semiconductor substrate to said semiconductor thin film; and crystallizing said semiconductor thin film, wherein after said crystallizing said semiconductor thin film has a deviation between crystal orientations of adjoining crystallized regions of less than 5 degrees.

Another preferred embodiment of the present invention provides a method for manufacturing a semiconductor thin film, the method including: preparing a single crystal semiconductor substrate including a semiconductor element and having a catalytic metal at least on a surface; forming a non-crystalline semiconductor thin film including said semiconductor element on a substrate, said semiconductor thin film having a larger area than said surface of said single crystal semiconductor substrate; touching said surface of said single crystal semiconductor substrate to said semiconductor thin film; and crystallizing said semiconductor thin film at a lower temperature than an inherent crystallizing temperature of a pure semiconductor layer including said semiconductor element.

Preferably, the touching may be carried out at plural times.

Preferably, a plurality of said single crystal semiconductor substrates may be used in said touching.

Another preferred embodiment of the present invention provides a method for manufacturing a semiconductor thin film transistor having a channel, a gate, a source and a drain, the method including: preparing a single crystal semiconductor substrate including a semiconductor element and having a catalytic metal at least on a surface; forming a non-crystalline semiconductor thin film including said semiconductor element on a substrate; touching said surface of said single crystal semiconductor substrate to said semiconductor thin film; crystallizing said semiconductor thin film at a lower temperature than an inherent crystallizing temperature of a pure semiconductor including said semiconductor element; and patterning said semiconductor thin film for said channel.

Preferably, the patterning may be carried out after the crystallizing.

Preferably, the patterning may be carried out before the touching.

Preferably, a portion of the semiconductor thin film touched to the single crystal semiconductor substrate in the touching may remain touching in the patterning and/or may remain in the patterning.

The present invention also includes a semiconductor thin film transistor and a semiconductor thin film made by the above processes, as well as devices which include semiconductor thin film transistors and semiconductor thin films made by the above processes.

Figure 2:
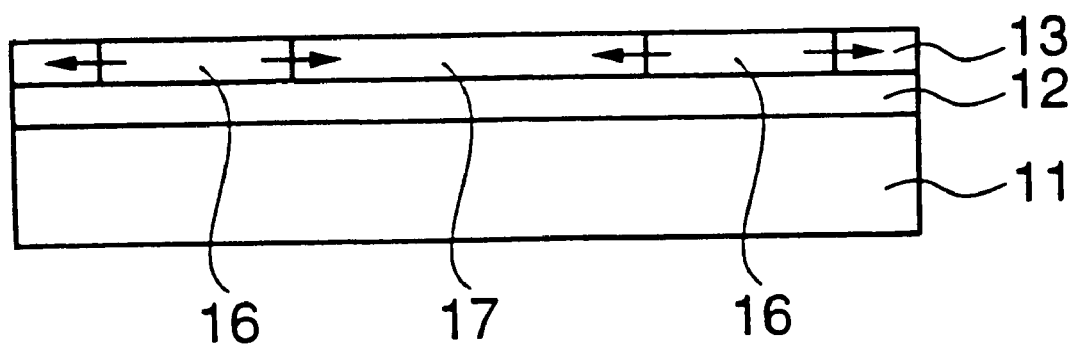
FIG. 2 illustrates the method for forming a crystalline semiconductor thin film according to the first embodiment of the invention.

FIGS. 1 and 2 show a first embodiment of a method for forming a crystalline semiconductor thin film according to a preferred embodiment of the invention. FIG. 1 also shows a partial enlarged view of a part of a section indicated by a circle. A method for forming a crystalline semiconductor thin film according to a first embodiment will be described with reference to those figures.

First, as shown in FIG. 1, an insulation layer 12 made of $SiO_2$, SiN or the like is formed to a thickness of about 200 nm on an insulated substrate 11 made of glass using a sputtering process, a chemical vapor deposition process (CVD process) or the like. An amorphous Si thin film 13 is formed to a thickness of about 100 nm on the insulation layer 12 using a sputtering process, a CVD process or the like. While the thickness depends on the device specifications, a thickness of about 10 nm or more will result in no particular problem during crystallization.

Although the amorphous Si thin film 13 is used for explanation in the embodiments, the Si thin film 13 may be non-crystalline layer. For example, the Si thin film may be poly-crystalline layer.

While a glass substrate is used as the insulated substrate in the present embodiment, an AlN ceramic substrate, a metal substrate or the like may be used instead. Since problems can arise during crystallization of an amorphous Si film when it includes a great amount of impurity, a dose of about $5 \times 10^{18}$ atoms/cm$^3$ or less is desirable for doping with B, P or the like. Further, since an amorphous Si thin film formed using a CVD process or the like includes hydrogen on the order of a few percent which can hinder crystallization, a thermal process is preferably performed to reduce it sufficiently. In the present embodiment, a thermal process is performed at about 500° C. for about 30 minutes to reduce the hydrogen concentration of the film from an initial concentration of about 5% to about 1% or less.

Although the amorphous Si thin film 13 thus formed is controlled such that it has a uniform thickness on average, microscopic irregularities are locally formed.

A single crystal Si substrate 14 for controlling crystal orientation is provided. In the present embodiment, for example, a p-type substrate is used whose principal plane is an {111}-plane and whose resistivity is about 10 Ω·cm.

First, a sputtering process is performed to form nickel with a thickness of about 10 nm on the surface of the single crystal Si substrate as a catalytic metal for promoting crystallization. At this time, Ni may be introduced to the surface of the single crystal Si substrate using a method such as diffusion. Next, a thermal process is performed at about 300° C. for about 30 minutes, and the Ni layer on the surface is etched and removed. When Ni atoms are combined with Si on the surface of Si as a result of a reaction during the film formation, such a thermal process is not essential.

At least one of Ni, Co, Au, Pd, Pt, Cu and Fe may be used as the catalytic metal.

The amorphous Si thin film 13 and single crystal Si substrate 14 are put into contact with each other after the surfaces of them are sufficiently cleaned to remove any natural oxide film or the like. They are kept in a $N_2$ atmosphere for about 10 hours at a temperature of about 500° C.

The surface of the amorphous Si thin film 13 and the surface of the single crystal Si substrate 14 are in contact with each other at the convex portions of the microscopic irregularities of the amorphous Si thin film 13.

Normally, only a very small part of the amorphous Si thin film 13 is crystallized at about 500° C. However, as shown in the enlarged part in FIG. 1, low temperature solid state epitaxy is started by an effect of the Ni catalyst to decrease the crystallizing temperature at contacts 15 of the amorphous Si thin film 13. The crystal orientation of crystals that starts to grow on the amorphous Si thin film 13 is the same as that of the single crystal Si substrate 14. Thereafter, as the thermal process proceeds, crystallized regions 16 around the contacts 15 of the Si thin film 13 expand along the layer as indicated by the arrows in FIG. 2, which eventually results in crystallization of amorphous regions 17. As a result, the amorphous Si thin film 13 as a whole turns into crystallized regions 16.

The crystallized regions 16 become a single crystal thin film which substantially has {111}-crystal planes like those of the single crystal Si substrate 14 throughout the entire region thereof. Since the crystal orientation of the crystallized regions 16 is the same as that of the single crystal Si substrate 14, there is substantially no grain boundary which constitutes a plane of discontinuity of crystals.

The crystal orientation of each of the crystallized regions 16 was evaluated by observing the pattern of diffraction of an electron beam at the part using a transmission type electron microscope.

In the present embodiment, the plane orientation of the single crystal Si substrate is <111> which is the orientation of a crystal axis perpendicular to the surface of the substrate. Here, the observation was focused on three orientations, i.e., the plane orientation <111> and crystal orientations <01–1> and <–211>.

An evaluation was made on how much those directions were shifted from the crystalline Si substrate in the crystallized regions 16 of the Si thin film. There was a deviation of 3° or less between the directions of crystal axes <01–1> and <–211> projected upon a Si thin film interface of the crystallized regions 16 thus formed and the directions of crystal axes <01–1> and <–211> on the surface of the single crystal substrate. There was a deviation of 5° or less between crystal axis orientations <111>, <01–1> and <–211> of the crystallized region 16 and crystal axis orientations <111>, <01–1> and <–211> of the single crystal Si substrate in contact therewith. Thus, grain boundaries between crystallized regions adjacent to each other are substantially continuous, and no clearly discontinuous region was observed.

However, when the crystallizing temperature is reduced extremely, for example, to about 400° C. or less, the deviation between the crystal orientations of adjoining crystallized regions increases and, as a result, clear grain boundaries appear. The reason is that the speed of crystal growth significantly decreases at about 400° C. or less even if a catalyst is used. As a result, crystal nuclei having similar crystal planes and crystal orientations are not grown largely and, if crystallization is carried out thereafter at a higher temperature, the Si thin film becomes polycrystals.

In order to obtain substantially continuous grain boundaries, it is preferable to select a crystallizing temperature at which the deviation between the crystal orientations of adjoining crystallized regions is 5° or less or, more preferably, 3° or less.

In the present embodiment, a thermal process is carried out with the amorphous Si thin film 13 formed on the insulation layer 2 put in partial contact with the single crystal Si substrate 14 at a temperature which normally causes no crystallization of the amorphous Si thin film 13. Since a catalytic metal having an effect of decreasing the crystallizing temperature to promote crystallization is added on the surface of the single crystal Si substrate 14 in advance, crystallization proceeds from the contacts 15 between the substrate and thin film. Since all of the contacts 15 are in contact with the single crystal Si substrate having similar crystal planes and crystal orientations, crystals having similar crystal planes and crystal orientations are grown, and it is therefore possible to control the orientation of crystallization of the amorphous Si thin film. As a result, the amorphous Si thin film becomes a crystalline film having excellent continuity, i.e., a substantially monocrystalline thin film.

While a p-type substrate whose principal plane is a {111}-plane and whose resistivity is about 10 Ω·cm are used as the single crystal Si substrate in the present embodiment, the orientation of the crystal plane and the conductivity of the substrate are not limited to this example.

For example, a single crystal Si substrate whose principal plane is a {100}-plane may be used and, in this case, the plane orientation of the resultant Si thin film is a {100}-plane.

A catalytic metal in the context of the invention may be any metal as long as it can decrease the crystallizing temperature of an amorphous semiconductor thin film, and there is no limit on the type of the catalytic metal used. While Ni atoms are used in the present embodiment, Co, Au, Pd, Pt, Cu, Fe or the like may be used instead of Ni.

Further, generation of crystal nuclei can be ensured by performing dry etching of any oxide film on the amorphous Si thin film 13 formed on the glass substrate and the Si surface of the single crystal Si substrate 14 and by continuously starting a thermal process with the thin film and substrate put in contact with each other in the same apparatus. At this time, the thermal process is preferably performed in an enclosed space in which exhausting function is available.

A second embodiment of the invention will now be described.

The second embodiment of the invention will be described with reference to FIG. 1 used for the description of the first embodiment, the description being focused on differences from the first embodiment.

In the present embodiment, SiO$_2$ is formed to a thickness of about 200 nm as an insulation layer 12 on an insulated substrate 11 similarly to the first embodiment. An amorphous Si thin film 13 is formed to a thickness of about 100 nm on the same using a plasma CVD process. Thereafter, a thermal process is performed at about 500° C. for about 30 minutes to decrease the concentration of hydrogen in the amorphous Si thin film 13 sufficiently.

Next, Ni is formed to a thickness of about 10 nm on the surface of a single crystal Si substrate 14 whose principal plane is a {111}-plane, and a thermal process is performed at about 300° C. for about 30 minutes. The Ni layer on the surface is thereafter etched and removed. Here, Ni serves as a catalytic metal for promoting crystallization. A catalytic metal in the context of the invention may be any metal as long as it can decrease the crystallizing temperature of an amorphous semiconductor thin film, and there is no limit on the type of the catalytic metal used. While Ni atoms are used in the present embodiment, Co, Au, Pd, Pt, Cu, Fe or the like may be used instead of Ni.

The surfaces of the amorphous Si thin film 13 and single crystal Si substrate 14 are sufficiently cleaned to remove any natural oxide film or the like. Thereafter, the thin film and substrate are put into contact with each other and are subjected to a first thermal processing step at which they are kept in a $N_2$ atmosphere for about 2 hours at a temperature of about 500° C. During the same period, low temperature solid state epitaxy is started by an effect of the Ni catalyst to decrease the crystallizing temperature at contacts 15 of the amorphous Si thin film 13 where it contact with the substrate, which causes crystallization.

When the thin film and substrate are separated thereafter, a plurality of crystallized regions 16 are generated in the amorphous Si thin film 13. The crystal plane and crystal orientation of each of the crystallized regions 16 are the same as those of the single crystal Si substrate 14.

After the thin film and substrate are separated, the amorphous Si thin film 13 including the plurality of crystallized regions 16 is subjected to another thermal process in a $N_2$ atmosphere at a temperature of about 550° C. for about 3 hours as a second thermal processing step. Amorphous regions 17 in the amorphous Si thin film 13 disappear as a result of expansion of the crystallized regions 16. That is, the amorphous Si thin film 13 as a whole turns into crystallized regions 16. Since the crystal orientation of the crystallized regions 16 is the same as that of the single crystal Si substrate 14, the Si thin film 13 entirely turns into a single crystal thin film having a {111}-crystal plane. Substantially no discontinuous grain boundary is generated at interfaces between adjoining crystallized regions 16.

In the present embodiment, the first thermal processing step is first performed with the single crystal Si substrate 14 and amorphous Si thin film 13 put in contact with each other to form a plurality of crystallized regions 16. Thereafter, the single crystal Si substrate 14 and amorphous Si thin film 13 are separated. The second thermal processing step is then performed to crystallize the thin film entirely. This makes it possible to select conditions for the first thermal processing step for forming the initial crystallized regions 16 and conditions for the second thermal processing step for crystallizing the entire thin film independently of each other, which consequently increases alternatives for processing conditions, thereby allowing processing time to be shortened.

That is, the first thermal processing step is performed at a low temperature which normally causes no crystallization of the amorphous Si thin film 13, and the speed of crystallization can be increased when the second thermal processing step is thereafter performed at a higher temperature to crystallize the entire thin film. The crystallized regions 16 that serve as nuclei of crystals are formed only at the contacts 15 as a result of the effect of the catalytic metal, which allows the second thermal processing step to be performed in a short period of time.

If the thermal process is performed at only a single step at a high temperature, a problem arises in that crystal nuclei with uncontrolled crystal planes and crystal orientations are formed in various locations of the amorphous Si thin film 13.

On the contrary, when a first thermal process is first performed at a low temperature which does not cause crystallization of the amorphous Si thin film 13, crystallized regions 16 with controlled crystal planes and crystal orientations are formed only at contacts 15. When a second thermal process is thereafter performed at a higher temperature, even if new crystal nuclei with uncontrolled crystal planes and crystal orientations are formed, the growth of the crystallized regions 16 formed at the first thermal process hinders the new crystal nuclei from growing. As a result, the crystallized regions 16 expand to cover the Si thin film entirely, thereby turning the same film into a single crystal. Thus, crystal planes and crystal orientations are controlled on the entire thin film.

While conditions for thermal processing are altered after separating the amorphous Si thin film 13 and single crystal Si substrate from each other after the first thermal processing step in the present embodiment, the conditions for thermal processing may be continuously altered without separating the thin film and substrate.

If the temperature for the second thermal processing step is increased to about 600° C. or more, crystallization independently occurs also in the amorphous regions 17 to grow crystals different from the crystallized regions 16 at a high speed. Thus, a single crystal can not be provided, and grain boundaries are generated. Therefore, the temperature for thermal processing is preferably about 600° C. or less.

If a thermal process at about, for example, 600° C. is performed after crystallization proceeds to make all of the crystallized regions 16 continuous, microscopic crystal defects in the crystallized regions 16 can be effectively reduced.

Figure 3:
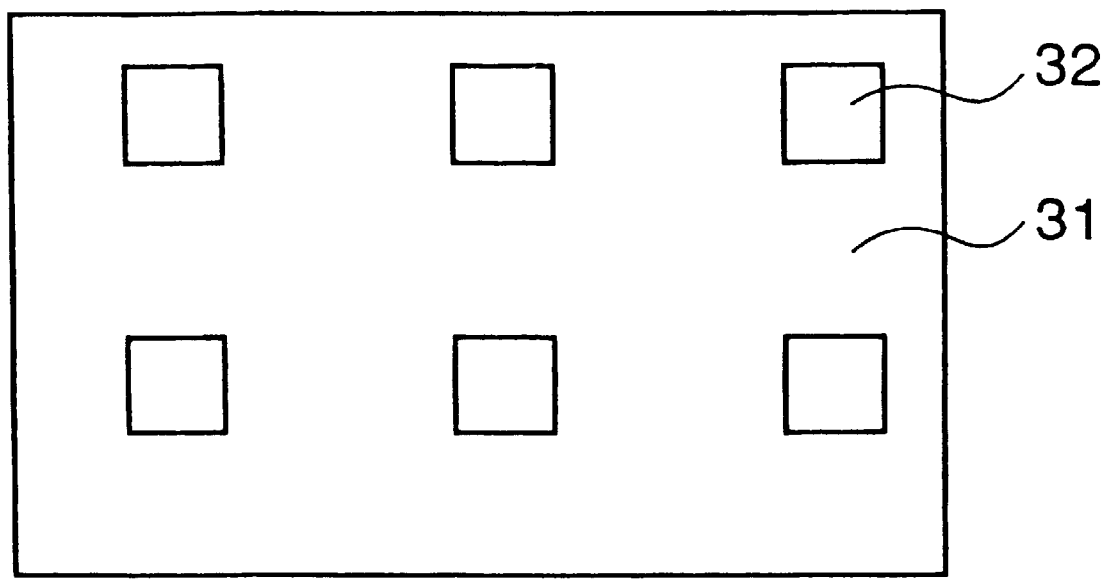
FIG. 3 illustrates a method for forming a crystalline semiconductor thin film according to a third embodiment of the invention.
Figure 4:
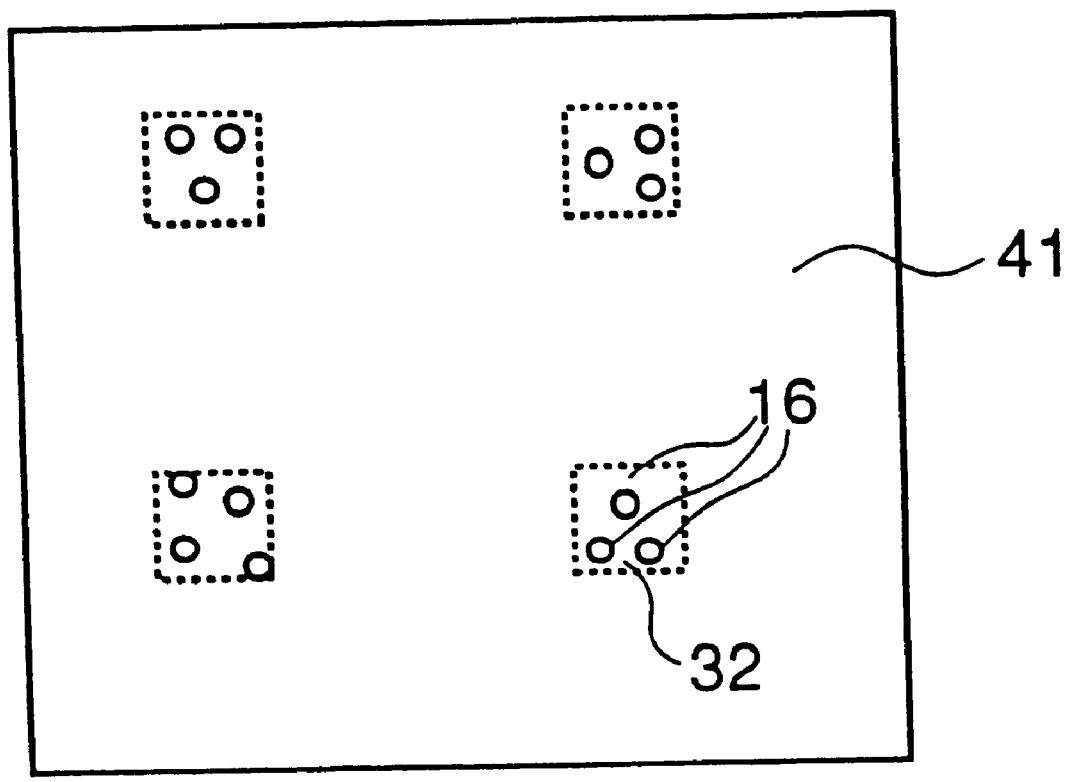
FIG. 4 illustrates the method for forming a crystalline semiconductor thin film according to the third embodiment of the invention.

FIGS. 3 and 4 show a third embodiment of the method for manufacturing a crystalline Si thin film according to the invention. In the present embodiment, a catalytic metal is formed in limited locations on a single crystal Si substrate. The third embodiment will be described with reference to FIGS. 3 and 4, the description being focused on differences from the second embodiment.

In the present embodiment, similarly to the second embodiment, an insulation layer 12 is formed on an insulated substrate 11 as in FIG. 1, and amorphous Si thin film 13 is formed on the insulation layer 12.

FIG. 3 shows a top surface of a single crystal Si substrate 14. As shown in FIG. 3, catalytic metal containing regions 32 containing a catalytic metal are cyclically formed a top surface 31 of the single crystal Si substrate.

For example, the catalytic metal containing regions 32 are formed as follows. A resist is applied in advance to the top surface 31 of the single crystal Si substrate excluding the regions to be turned into the catalytic metal containing regions 32. A catalytic metal such as Ni is thereafter formed on the entire surface. Then, the catalytic metal on the resist is lifted off to remove the catalytic metal from regions other than the catalytic metal containing regions 32. In the present embodiment, the catalytic metal containing regions 32 are formed with a size of about 5×5 $\mu m^2$ at a pitch of about 30 $\mu m$ in both of X- and Y-directions.

Alternatively, the catalytic metal containing regions 32 may be formed after oxidizing the top surface 31 of the single crystal Si substrate to form an oxide film thereon. In this case, an oxide film is formed on the top surface 31 of the single crystal Si substrate, and a resist layer is formed on the same. Thereafter, the resist layer is patterned, and the oxide film is etched to expose the top surface 31 of the single crystal Si substrate. Thereafter, the resist is peeled off, and the oxide film is etched after forming a catalytic metal on the entire surface. As a result, the catalytic metal on the oxide film is also removed, and regions excluding the resist pattern become catalytic metal containing regions 32.

Next, a first thermal processing step is performed with the amorphous Si thin film 13 and the single crystal Si substrate put in contact with each other under the same conditions as in the second embodiment. This results in localized crystallization. The thin film and substrate are thereafter separated. FIG. 4 shows a top surface of the amorphous Si thin film 13. As shown in FIG. 4, crystallized regions 16 are formed in regions of a top surface 41 of the amorphous Si thin film corresponding to the catalytic metal containing regions 32. The amorphous Si thin film 13 separated from the single crystal Si substrate 14 is subjected to a second thermal processing step at which it is kept at about 550° C. for about 10 hours. This expands the crystallized regions 16 to crystallize the top surface 41 of the amorphous Si thin film as a whole.

When the amorphous Si thin film 13 formed with the crystallized regions 16 is separated from the single crystal Si substrate 14, microscopic damage can occur on the film at locations where the thin film and substrate contact with each other. Specifically, the film is damaged when the thin film and substrate are separated because crystallization at the contacts has bonded the thin film and substrate. Although such film damage is microscopic, TFT characteristics can be adversely affected when the TFTs are formed in the damaged regions. Such film damage occurs only in the crystallized regions 16 which are bonded with the single crystal Si substrate 14. In the present embodiment, regions to become the crystallized regions 16 correspond to limited regions of the single crystal Si substrate 14 instead of the entire surface thereof to make it possible to limit locations where film damage can occur. This becomes possible by providing the catalytic metal containing regions 32 only in part of the single crystal Si substrate 14. According to the present embodiment, since film damage that can occur at the step of separating the thin film and substrate is limited to the catalytic metal containing regions 32, designs may be employed in which TFTs are formed outside the catalytic metal containing regions 32. It is therefore possible to avoid deterioration of TFT characteristics.

A fourth embodiment of the invention will now be described with reference to FIGS. 5 through 9. FIGS. 5 through 9 show a fourth embodiment of the method for manufacturing a crystalline Si thin film according to the invention.

In the present embodiment, projections are provided on a single crystal Si substrate 14 according to the procedure shown in FIGS. 5 through 8, and the projections are put into contact with amorphous Si thin film 13 on an insulated substrate 11. Crystallization is cause at the contacting projections with controlled crystal planes and crystal orientations.

Figure 5:
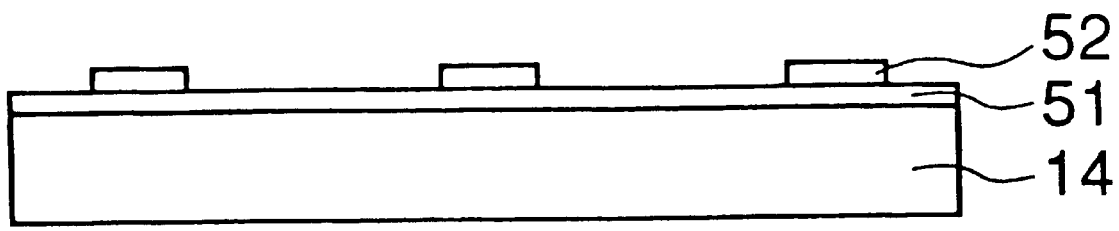
FIG. 5 illustrates a method for forming a crystalline semiconductor thin film according to a fourth embodiment of the invention.
Figure 6:
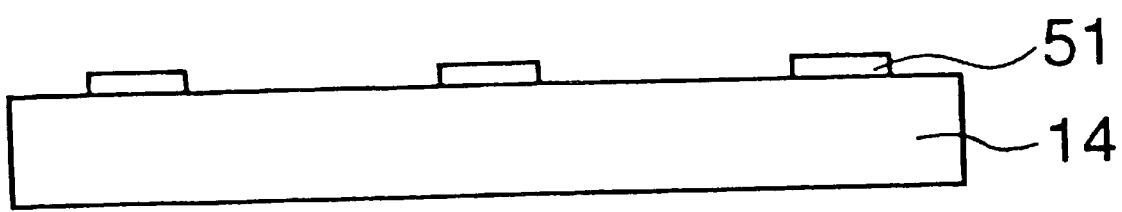
FIG. 6 illustrates the method for forming a crystalline semiconductor thin film according to the fourth embodiment of the invention.

First, as shown in FIG. 5, a single crystal Si substrate 14 whose principal plane is a {100}-crystal plane is provided. An oxide film 51 made of $SiO_2$ is formed to a thickness of about 100 nm on the same. Thereafter, a photosensitive resist is applied to perform exposure and development, thereby forming patterns 52 in a size of about 3×3 $\mu m^2$ at a pitch of about 10 $\mu m$. The oxide film 51 is then etched using the patterns 52 as a mask. As a result, a pattern of oxide films 51 is obtained as shown in FIG. 6.

Figure 7:
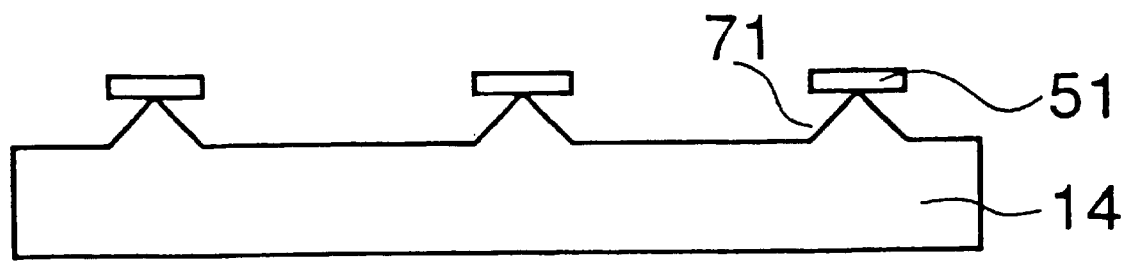
FIG. 7 illustrates the method for forming a crystalline semiconductor thin film according to the fourth embodiment of the invention.

Next, anisotropic etching is performed on the surface of the single crystal Si substrate 14 using the oxide films 51 thus patterned. In the present embodiment, a mixture of ethylenediamine $((NH_2)_2CH_2)$ and pyrocatechol $(C_6H_4(OH)_2)$ is used as the anisotropic etchant. As shown in FIG. 7, the anisotropic wet etching forms pyramidal Si patterns 71 having {111}-planes on the lateral faces thereof on the surface of the single crystal Si substrate 14. It is not essential that the tops of the Si patterns 71 are pointed, and they may have flat surfaces instead.

Figure 8:
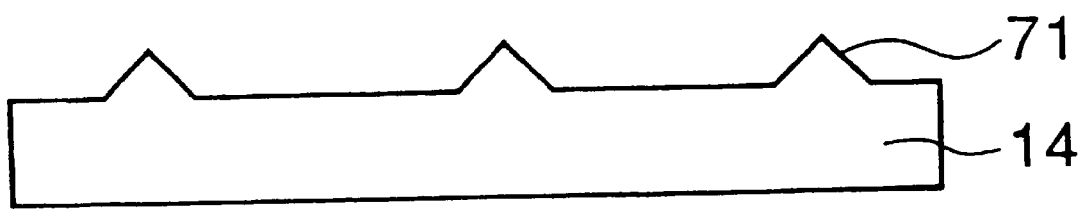
FIG. 8 illustrates the method for forming a crystalline semiconductor thin film according to the fourth embodiment of the invention.

Next, the patterned oxide films 51 that have served as an etching mask are etched and removed as shown in FIG. 8.

Thereafter, sputtering is performed to form Ni to a thickness of about 5 nm on the entire surface of the single crystal Si substrate 14, and a thermal process is performed at about 300° C. for about 30 minutes. The Ni film on the surface is thereafter etched and removed to complete a single crystal Si substrate for orientation.

Next, an insulation layer 12 made of $SiO_2$ having a thickness of about 200 nm is formed on an insulated substrate 11 made of, for example, glass, and an amorphous Si thin film 13 having a thickness of about 100 nm is formed on the insulation layer 12. The concentration of hydrogen in the amorphous Si thin film 13 is decreased in advance in the same manner as that in the first embodiment.

Figure 9:
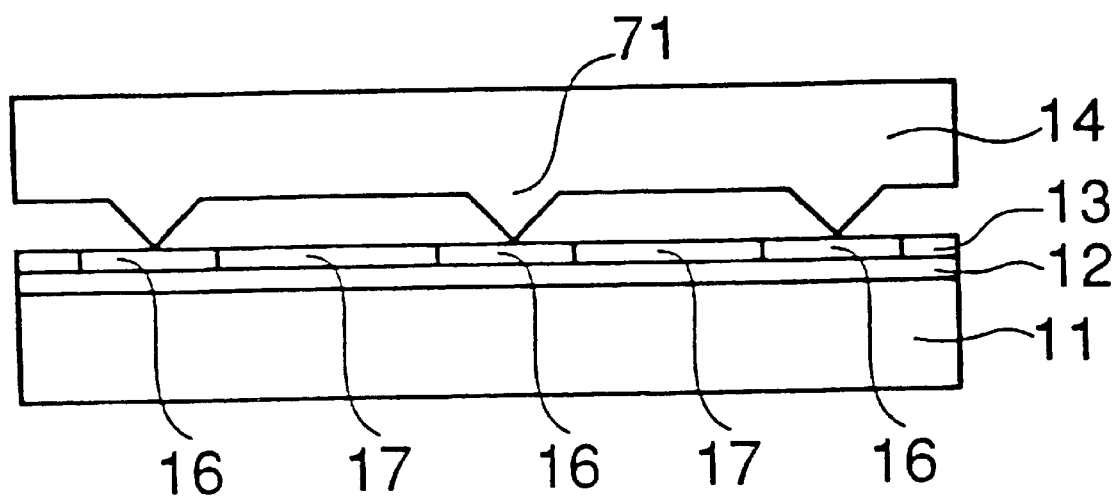
FIG. 9 illustrates the method for forming a crystalline semiconductor thin film according to the fourth embodiment of the invention.

As shown in FIG. 9, the single crystal Si substrate 14 is put in contact with the amorphous Si thin film 13 in a face-to-face relationship. They are subjected to a thermal process in a $N_2$ atmosphere at a temperature of about 550° C. for 30 minutes. This process crystallizes regions of the amorphous Si thin film 13 in contact with the Si patterns 71 to form crystallized regions 16. They have crystal planes in a {100}-orientation.

After the thermal process, the amorphous Si thin film 13 and single crystal Si substrate 14 are separated.

Thereafter, the amorphous Si thin film 13 is subjected to a thermal process at about 550° C. for about 4 hours to crystallize amorphous regions 17 completely. All of the crystallized regions 16 have {100}-crystal planes, and the crystallized regions 16 expand. Therefore, the amorphous regions 17 will have the same crystal orientation as that of the crystallized regions 16. Consequently, the amorphous Si thin film 13 becomes a crystalline Si thin film which has {100}-crystal planes similarly to the single crystal Si substrate 14 on the entire surface thereof.

In the present embodiment, the amorphous Si thin film 13 and single crystal Si substrate 14 contact with each other in locations which are intentionally limited. It is therefore possible to limit locations where film damage can occur in advance for the same reason as that in the third embodiment. Further, the projections provided on the single crystal Si substrate 14 allow the contact between the thin film and substrate to be more preferably controlled.

When crystallization is extended to the entire surface, crystallization may be performed after the formation of the crystallized regions 16 at a temperature and for a duration sufficient to cause crystallization to proceed the distance between adjoining Si patterns 71.

Since contact may be insufficient in some locations, conditions for the thermal process for crystallizing the entire surface may be adjusted. For example, conditions may be selected which cause crystal growth to proceed a distance twice the interval between adjoining Si patterns 71.

Specifically, the distance between two Si patterns adjacent to each other is about 10 $\mu m$ in the present embodiment. Since crystallization proceeds from each of the crystallized regions 16, conditions to allow crystallization to proceed a distance of about 5 $\mu m$ must be set. In consideration to occurrence of a location of non-contact, it is assumed that there is a distance of about 20 $\mu m$ between two Si patterns 71, and conditions to allow growth of about 10 $\mu m$ are set. For example, the conditions are specifically a heating temperature at about 550° C. and a processing time of about 4 hours. A longer time must be spent for the thermal process when the annealing temperature is to be decreased.

In short, those Si patterns 71 are required to be in an arrangement that substantially turns the amorphous Si thin film 13 into a single crystal Si thin film.

While a substrate with a {100}-plane orientation is used as the single crystal Si substrate 14 in the present embodiment, this is not limiting the present invention. For example, projections in the form of hexagonal pyramids may be formed through anisotropic etching on a single crystal Si substrate whose principal plane is a {100}-plane. In this case, the plane orientation of each incline face is a {111}-plane. Thus, projections can be formed on a single crystal Si substrate as long as it has crystal planes other than the {111}-plane, although the projections may be in an asymmetric configuration. The inclined faces of such projections are {111}-planes.

In short, according to the present embodiment, the amorphous Si thin film 13 formed on the insulated substrate 11 and the single crystal Si substrate 14 can be put in contact at a prescribed pitch. This is because the projections can be easily formed in controlled positions.

FIGS. 10 through 14 show a fifth embodiment of the invention. The fifth embodiment will be described with reference to FIGS. 10 through 14.

In the present embodiment, similarly to the fourth embodiment, projections are formed on a single crystal Si substrate, and the projections are put into contact with an amorphous Si thin film 13. The present embodiment is different from the fourth embodiment in the method for forming the projections, and the description will be focused on steps therefor.

Figure 10:
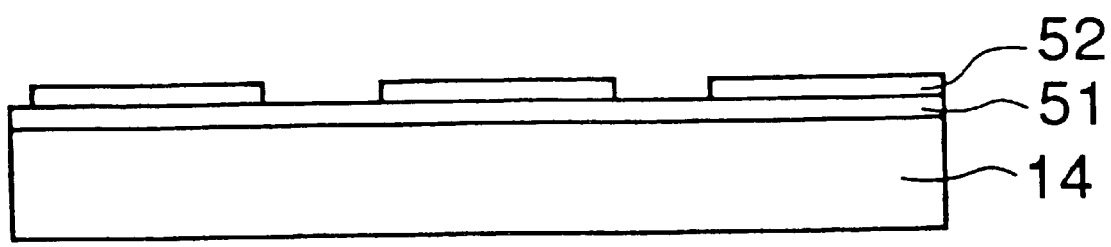
FIG. 10 illustrates a method for forming a crystalline semiconductor thin film according to a fifth embodiment of the invention.

First, referring to FIG. 10, the principal plane of the single crystal Si substrate 14 is a {111}-plane. An oxide film 51 made of $SiO_2$ is formed to a thickness of about 100 nm on the single crystal Si substrate 14. A photosensitive resist is applied thereon and is exposed and developed into predetermined patterns 52. Here, the patterns 52 are formed in a size of about 3×3 $\mu m^2$ and at a pitch of about 20 $\mu$m.

Figure 11:
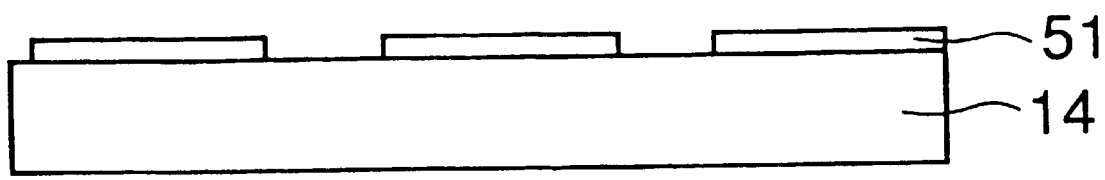
FIG. 11 illustrates the method for forming a crystalline semiconductor thin film according to the fifth embodiment of the invention.

The oxide film 51 is then etched using the patterns 52 as a mask. As a result, islands of the oxide film 51 are formed as shown in FIG. 11.

Figure 12:
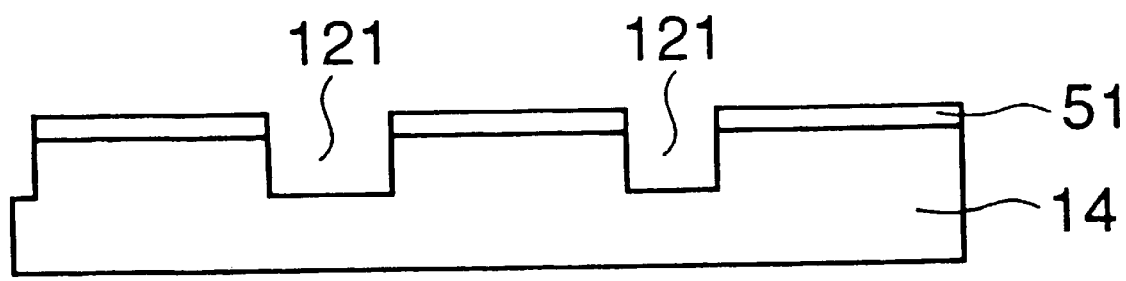
FIG. 12 illustrates the method for forming a crystalline semiconductor thin film according to the fifth embodiment of the invention.
Figure 13:
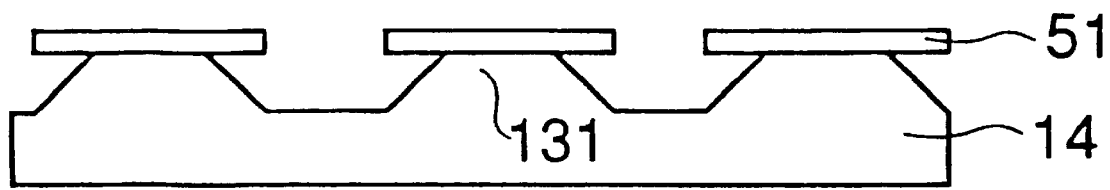
FIG. 13 illustrates the method for forming a crystalline semiconductor thin film according to the fifth embodiment of the invention.
Figure 14:
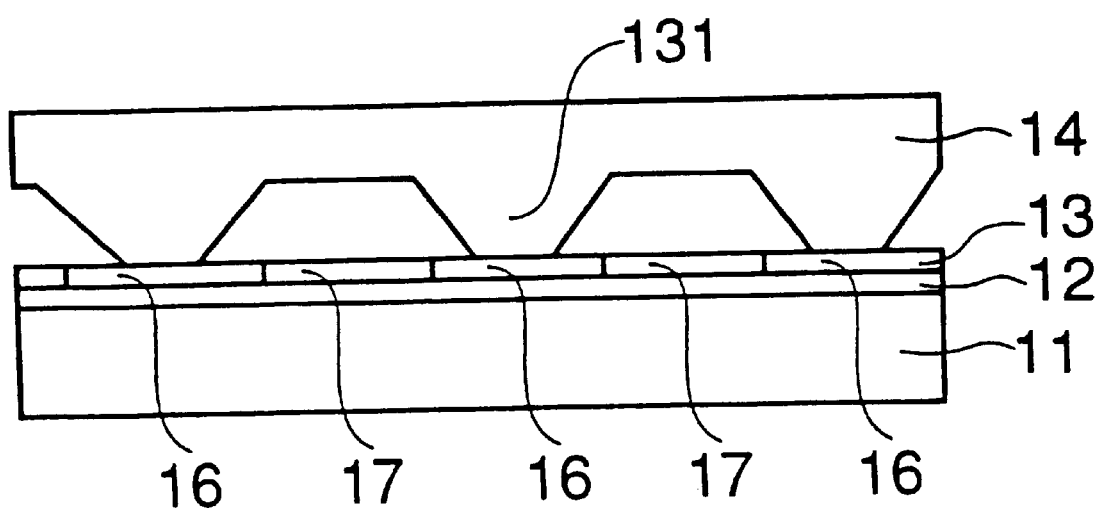
FIG. 14 illustrates the method for forming a crystalline semiconductor thin film according to the fifth embodiment of the invention.

Next, grooves 121 are formed using the patterned oxide films 51 as a mask as shown in FIG. 12. At this time, the single crystal Si substrate is subjected to dry etching. Thereafter, anisotropic wet etching is performed on the single crystal Si substrate 14 just as in the fourth embodiment. Then, projections 131 whose inclined faces are {111}-planes are formed as shown in FIG. 13. This is because the etching rate significantly decreases on {111}-planes. Specifically, since the lateral surfaces of the grooves 121 formed using dry etching have a plane orientation different from the {111}-plane, the etching that proceeds on those surfaces is anisotropic wet etching. However, since the etching rate abruptly decreases when {111}-plane are encountered, inclined surfaces are formed and the projections 131 are thus formed.

Thereafter, the oxide films 151 are removed to complete a single crystal Si substrate 14 having projections 131.

Then, similarly to the fourth embodiment, the projections 131 on the single crystal Si substrate 14 and the amorphous Si thin film 13 are put in contact with each other, and a thermal process is performed thereon. The amorphous Si thin film 13 can be thus crystallized.

With the method of the fourth embodiment, it is difficult to form projections on a single crystal Si substrate whose principal plane is a {111}-plane because of an extremely low etching rate on a {111}-plane. In the present embodiment, however, projections can be formed even on a single crystal Si substrate 14 whose principal plane is a {111}-plane. While the method of the present embodiment is therefore advantageous especially in forming projections on the surface of a single crystal Si substrate whose principal plane is a {111}-plane, it may be applied to a single crystal Si substrate whose principle surface has a plane orientation other than the {111}-plane.

The method of the present embodiment is advantageous especially when deep grooves 121 are to be provided to provide projections 131 with a large height. The reason is that influence of microscopic particles can be suppressed when the single crystal Si substrate 14 and amorphous Si thin film 13 are put into contact with each other. Specifically, the high projections 131 allow preferable contact between the single crystal Si substrate 14 and amorphous Si thin film 13 even if there are microscopic particles. It is therefore possible to prevent particles from being sandwiched between the thin film and substrate to make the contact imperfect.

Figure 15:
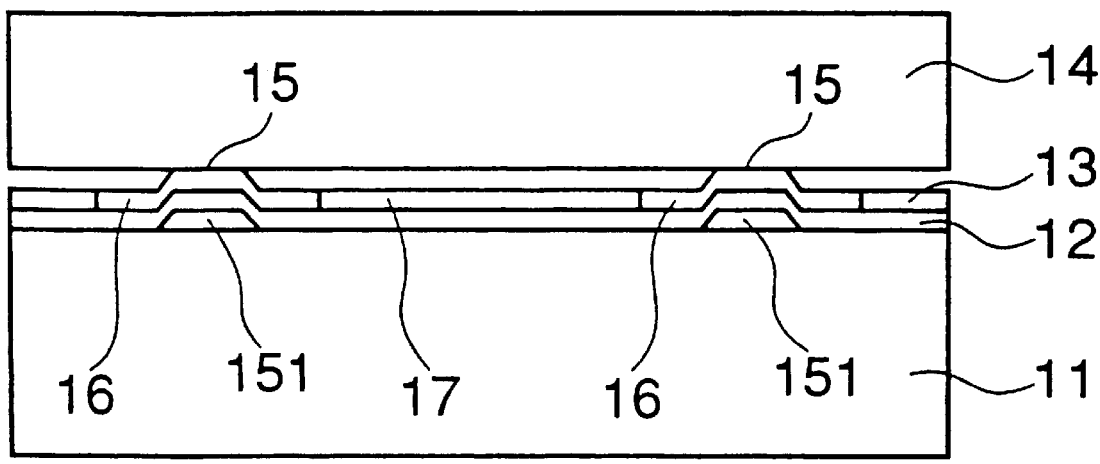
FIG. 15 illustrates a method for forming a crystalline semiconductor thin film according to a sixth embodiment of the invention.

FIG. 15 shows a sixth embodiment of the method for forming a crystalline Si thin film according to the invention. The sixth embodiment will be described with reference to FIG. 15.

In the present embodiment, an insulation layer 12 and an amorphous Si thin film 13 are formed after providing convex patterns on a substrate 11. The convex patterns produce irregularities on the amorphous Si thin film 13, and regions corresponding to the convex patterns serve as contacts. The single crystal Si substrate 14 and amorphous Si thin film 13 are put into contact with each other at the contacts and are subjected to a thermal process which crystallizes the amorphous Si thin film 13.

First, as shown in FIG. 15, convex patterns 151 are formed on, for example, on an insulated substrate 11.

The convex patterns 151 are formed as follows. First, a MoW metal thin film is formed to a thickness of about 150 nm on the entire surface of the substrate. Next, dry etching is performed using $CF_4$ and an $O_2$ type gas to process MoW metal thin films in a size of about 3×3 $\mu m^2$ and at a pitch of about 20 $\mu$m.

A plasma CVD process is performed to form an insulation layer 12 made of $SiO_2$ having a thickness of about 200 nm on the substrate 11 including the convex patterns 151. Subsequently, an amorphous Si thin film 13 having a thickness of about 100 nm is continuously formed using a plasma CVD process again. Thus, an amorphous Si thin film 13 having regular convex patterns 151 is formed on the insulated substrate 11.

Next, in order to decrease the concentration of hydrogen in the amorphous Si thin film 13, a thermal process is performed at about 500° C. for about 30 minutes.

The thin film is then put into contact with a single crystal Si substrate 14 whose principal plane is a {111}-plane, as shown in FIG. 15. Ni atoms to serve as a catalytic metal are added in advance on the surface of the single crystal Si substrate 14 similarly to the above-described embodiments.

A thermal process is performed on the thin film and substrate in contact in a $N_2$ atmosphere at about 500° C. for about one hour.

Crystallization starts at the contacts 15 in contact with the single crystal Si substrate 14 to form crystallized regions 16.

Further, the thin film and substrate are separated.

Thereafter, the amorphous Si thin film 13 is subjected to a thermal process in a $N_2$ atmosphere at about 550° C. for about 6 hours to crystallize the amorphous regions 17 in the amorphous Si thin film 13 completely. In this process, crystallization starts at the boundaries between the crystallized regions 16 and amorphous regions 17 and proceeds into the amorphous regions 17 to crystallize the entire thin film.

The amorphous Si thin film 13 can be finally controlled such that it has a {111}-plane which is the same as the plane orientation of the single crystal Si substrate 14 and such that it has substantially the same crystal orientation.

While the above description has referred to an example in which a pattern of MoW metal films is formed to form convex patterns 151 of an amorphous Si thin film 13, the present invention is not limited to such a method. For example, the same result can be achieved by forming an oxide film to a thickness of about 300 nm on the entire surface of the substrate using a plasma CVD process and by etching and removing a thickness of about 100 nm of the oxide film using a resist pattern as a mask. That is, projections constituted by oxide films with a height of 100 nm are formed on an oxide film with a thickness of 200 nm. In this case, the process is simple because only one kind of film is formed under the amorphous Si thin film 13, which is advantageous from a practical point of view.

Figure 16:
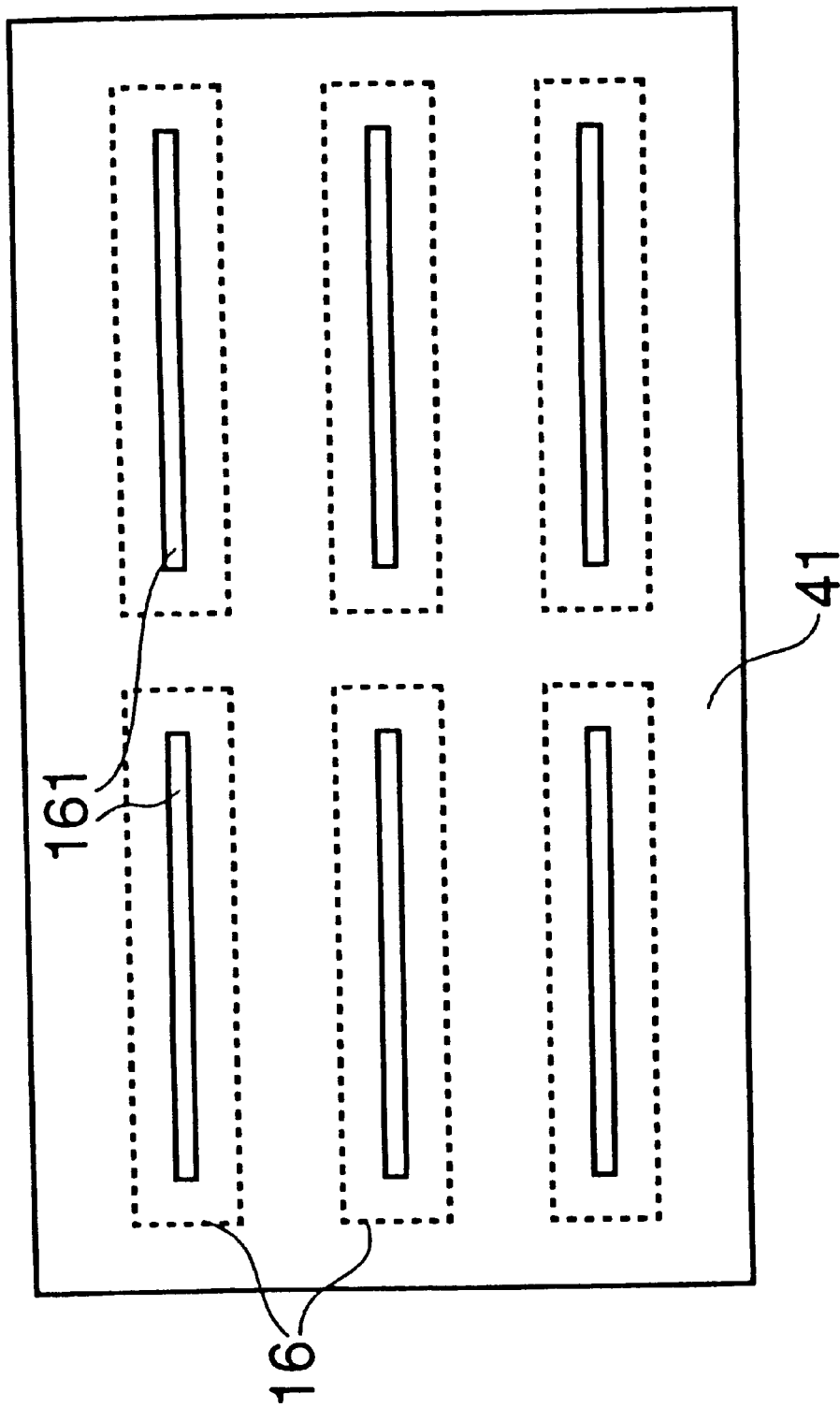
FIG. 16 illustrates a method for forming a crystalline semiconductor thin film according to a modification of the fourth through sixth embodiments of the invention.

While patterns to become contacts between a thin film and a substrate are formed as repetitive patterns in the form of points in the fourth, fifth and sixths embodiments, they may be linear patterns as shown in FIG. 16.

Referring to FIG. 16, linear patterns 161 are formed from MoW in a size of about 2×20 $\mu m^2$ at a pitch of about 20×40 $\mu m^2$ on the top surface 41 of the amorphous Si thin film. In this case, since crystallized regions 16 spread around the linear patterns 161 where the thin film contacts the substrate as shown in FIG. 16, crystal growth of about 20 $\mu m$ is required. For this purpose, the second thermal process that follows the separation of the thin film and substrate may be performed at about 550° C. for about 6 hours or more.

In the case of point-like patterns, since they provide a small contact area, there is the possibility of a reduction of the crystallizing speed, partial uncrystallized regions and the like because the amount of supplied Ni atoms decreases as the crystallized regions 16 expand. However, the use of the linear patterns 161 eliminates the problem of a short supply of a catalytic metal, which is advantageous especially in promoting crystallization over a long distance or in a wide range.

Figure 17:
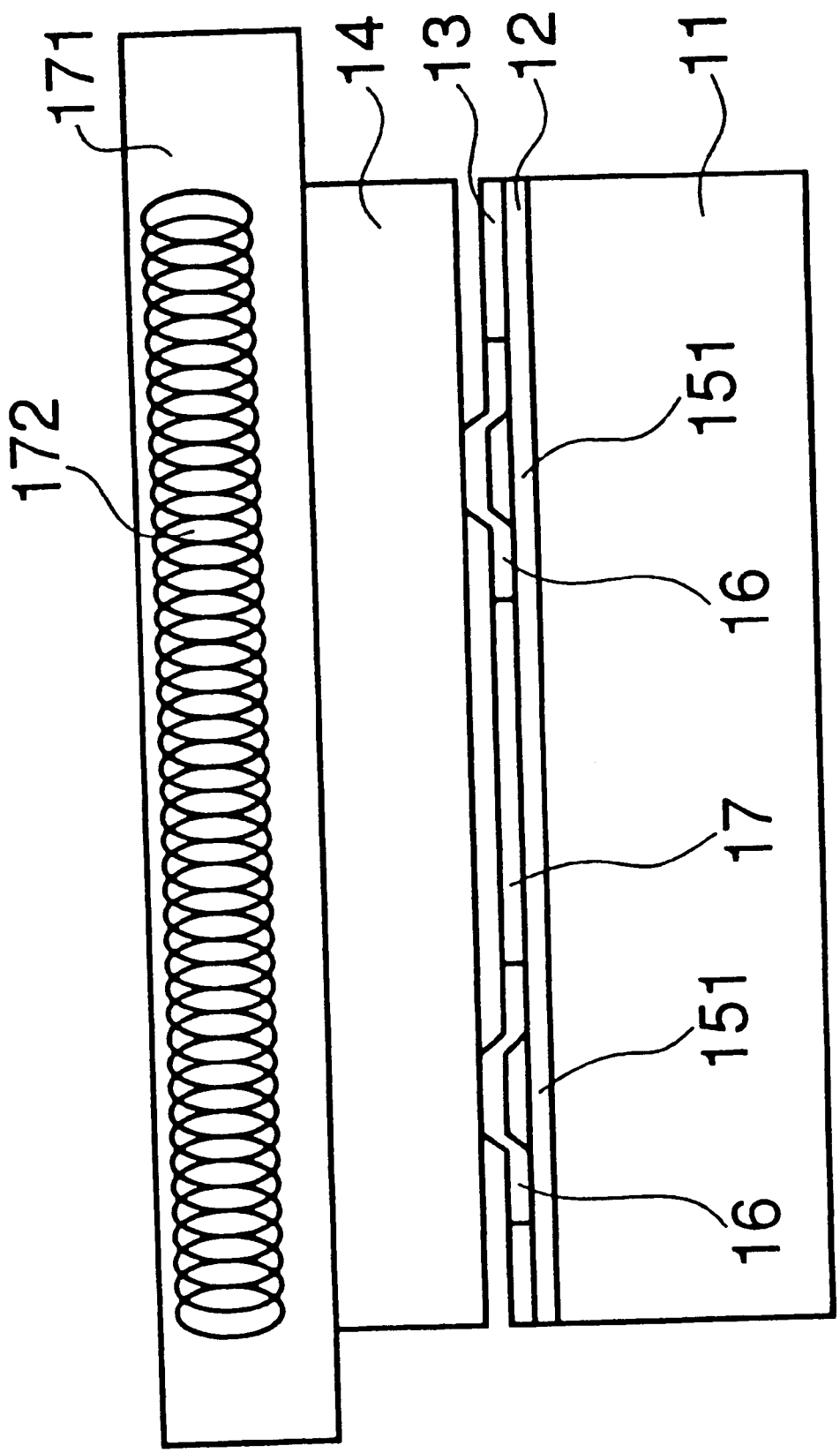
FIG. 17 illustrates a method for forming a crystalline semiconductor thin film according to a seventh embodiment of the invention.

FIG. 17 shows a seventh embodiment of the method for forming a crystalline Si thin film according to the invention. The seventh embodiment of the invention will be described with reference to FIG. 17.

The present embodiment employs a method for a thermal process in which means for localized heating of a single crystal Si substrate 14 is provided in addition to heating of the entire substrate in a thermal processing furnace. This makes it possible to provide a Si thin film having excellent crystallinity with less defects.

Similarly to the sixth embodiment, convex patterns 151 are formed on an insulated substrate 11, and an insulation layer 12 and an amorphous Si thin film 13 are formed thereon. The concentration of hydrogen in the amorphous Si thin film 13 is then decreased.

After adding Ni atoms on the surface of a single crystal Si substrate 14 whose principal plane is a {111}-plane as in the sixth embodiment, the single crystal Si substrate 14 is mounted to a substrate holder 171.

The substrate is thereafter put in contact with the amorphous Si thin film 13. A heater 172 is embedded in the substrate holder 171 to allow the single crystal Si substrate 14 to be heated.

The thin film and substrate in contact with each other are heated in a $N_2$ atmosphere to about 450° C.

The substrate holder 171 is heated by the heater 172 to adjust the temperature of the contacts between the thin film and substrate to about 600° C., and a thermal processing step is performed for about 10 minutes in this state. At this thermal processing state, crystallization proceeds from locations of the amorphous Si thin film 13 corresponding to the convex patterns 151. Therefore, crystallized regions 16 are formed in the locations corresponding to the convex patterns 151.

The thin film and substrate are thereafter separated from each other.

The amorphous Si thin film 13 is subjected to a thermal process at about 550° C. for about 6 hours which turns the amorphous Si thin film 13 into a crystalline film oriented to a {111}-crystal plane on the entire surface thereof.

In the present embodiment, since the temperature of the atmosphere for the process of forming initial crystal nuclei is as low as about 450° C., substantially no crystallization occurs in the amorphous Si thin film 13 in regions thereof which are not in contact with the single crystal Si substrate 14. It is therefore possible to substantially completely prevent generation of microscopic crystal grains having random crystal planes and crystal orientations. Such microscopic crystal grains hinder crystal growth starting from the convex patterns 151. In addition, since only the temperature of the contacts between the thin film and substrate can be increased without increasing the temperature of the amorphous Si thin film 13 as a whole, the speed of initial crystallization at the convex patterns 151 can be increased to shorten the processing time significantly.

In the present embodiment, crystallization is caused in two steps, i.e., the first thermal processing step for causing crystal growth with the thin film and substrate in contact with each other and the second thermal processing step performed after the thin film and substrate are separated.

However, it is possible to crystallize the amorphous Si thin film 13 as a whole in a short time only at the first thermal processing step.

Specifically, when the convex patterns 151 on the amorphous Si thin film 13 are in a size of about 3×3 $\mu m^2$ and at a pitch of about 20 $\mu m$, the amorphous Si thin film 13 as a whole can be turned into a preferable crystalline film by setting the same temperature as described above and a thermal processing time of about 2 hours as the conditions for the first thermal processing step. That is, the present embodiment allows independent control over conditions for obtaining a preferable crystalline film, i.e., the condition of a low temperature for suppressing the generation of random crystal nuclei at amorphous regions 17 and the condition of a high temperature for promoting the generation and growth of crystal nuclei at the convex patterns 151 in contact with the single crystal Si substrate 14.

Figure 18:
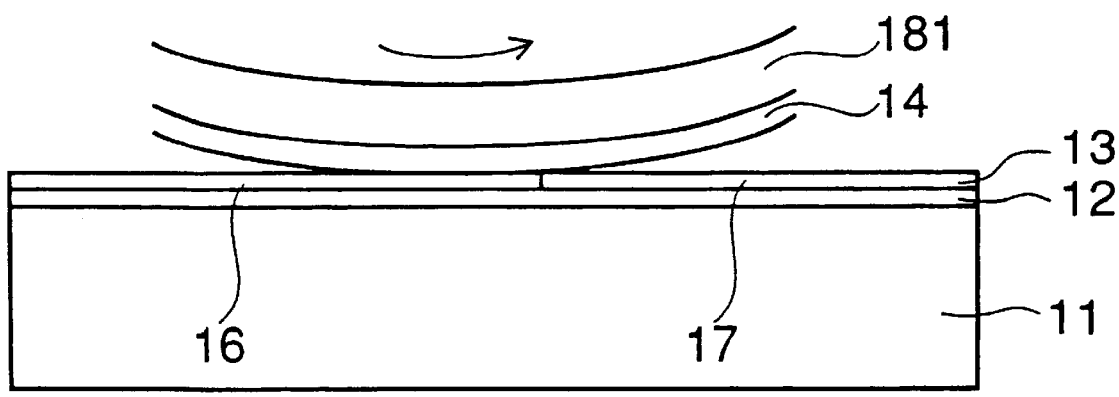
FIG. 18 illustrates a method for forming a crystalline semiconductor thin film according to an eighth embodiment of the invention.

FIG. 18 shows an eighth embodiment of the method for forming a crystalline Si thin film according to the invention. The eighth embodiment of the invention will be described with reference to FIG. 18.

In the present embodiment, a single crystal Si substrate 14 doped with Ni atoms is first provided in the same manner as that described in the above embodiments. As shown in FIG. 18, the single crystal Si substrate 14 is mounted on a substrate support base 181 having a curvature like a cylinder.

Next, an amorphous Si thin film 13 is formed on an insulation layer 12 as in the first embodiment.

The thin film and substrate are put into linear contact with each other by putting a surface having a curvature of the single crystal Si substrate 14 in contact with an end of the amorphous Si thin film 13. Then, as shown in FIG. 18, the substrate support base 181 is gradually rotated such that the contact region is moved. That is, crystallized regions 16 including crystal nuclei are formed on the amorphous Si thin film 13 by tilting the substrate support base 181 sequentially with the mechanism kept at a temperature of 550° C. Separation of the amorphous Si thin film 13 and single crystal Si substrate 14 proceeds simultaneously.

After crystallized regions 16 are formed in the entire amorphous Si thin film 13 in such a manner, a thermal process is performed at about 550° C. for about 10 hours to crystallize the amorphous Si thin film 13 as a whole. The present embodiment also makes it possible to turn the amorphous Si thin film 13 into a crystal film having similar crystal planes and crystal orientations in the entire region thereof by first forming a multiplicity of crystal nuclei with similar crystal planes and crystal orientations in the amorphous Si thin film 13 and thereafter crystallizing the thin film as a whole.

Figure 19:
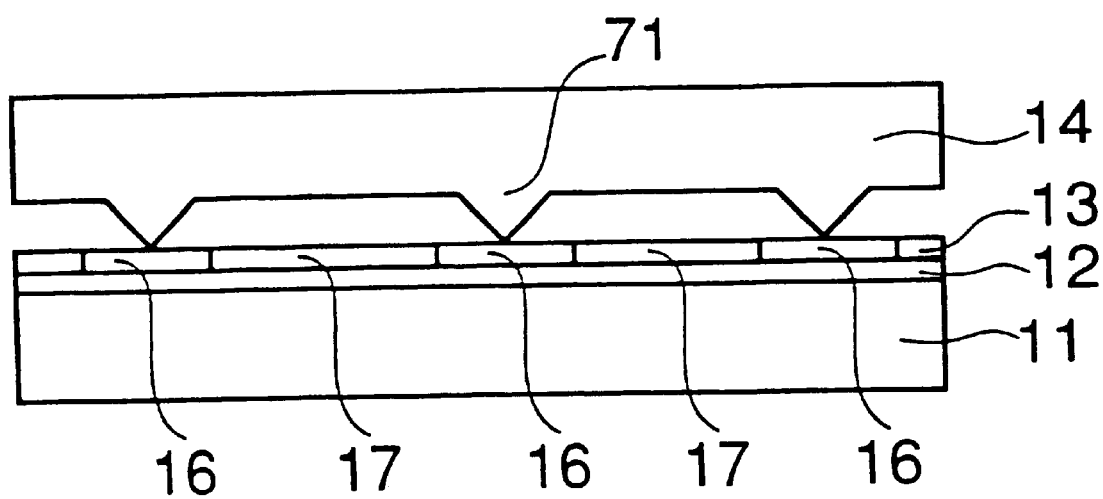
FIG. 19 illustrates a method for forming a crystalline semiconductor thin film according to a ninth embodiment of the invention.
Figure 20:
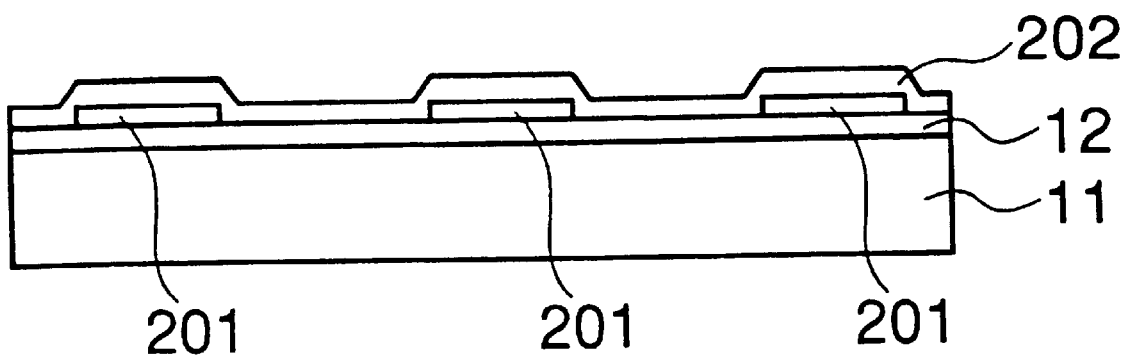
FIG. 20 illustrates the method for forming a crystalline semiconductor thin film according to the ninth embodiment of the invention.

FIGS. 19 and 20 show a ninth embodiment of the method for forming a crystalline Si thin film according to the invention. The ninth embodiment of the invention will be described with reference to FIGS. 19 and 20.

In the present embodiment, as shown in FIG. 19, the steps up to the formation of crystallized regions 16 in an amorphous Si thin film 13 are performed in the same manner as that in the fourth embodiment. After the crystallized regions 16 are formed in the amorphous Si thin film 13, Si thin film patterns 201 in the form of islands including at least the crystallized regions 16 are formed.

Next, as shown in FIG. 20, a second amorphous Si thin film 202 having a thickness of about 100 nm is formed on the entire surface of the insulation layer 12 on which the Si thin film patterns 201 are formed. A thermal process is thereafter performed at about 450° C. for about 1 hour to decrease the concentration of hydrogen. Thereafter, another thermal process is performed at about 550° C. for about 3 hours to crystallize the second amorphous Si thin film 202 as a whole.

In the present embodiment, the Si thin film patterns 201 having high crystallinity to serve as seed crystals are arranged; the second amorphous Si thin film 202 is formed on the same; and the thin film as a whole is thereafter crystallized. The present embodiment can therefore be divided into the first thermal processing step for forming seed crystals and the second thermal processing step for crystallizing the second amorphous Si thin film 202 as a whole. This is advantageous in that the amorphous Si thin film 202 is completely free from the possibility of being contaminated at the first thermal processing step and in that the finally formed crystalline Si thin film is unlikely to have contamination attributable to the step of forming seed crystals. It is therefore possible to suppress the entry of impurities that are easily ionized. Further, since crystal defects attributable to impurities and the like can be reduced, there is an advantage in that TFT characteristics can be reproduced with stability. Since the second amorphous Si thin film 202 has the same crystal plane and crystal orientation as those of the Si thin film patterns 201 with a control crystal plane and crystal orientation, substantially no grain boundary that constitutes a plane of discontinuity of crystals is generated similarly to the above-described embodiments.

Figure 21:
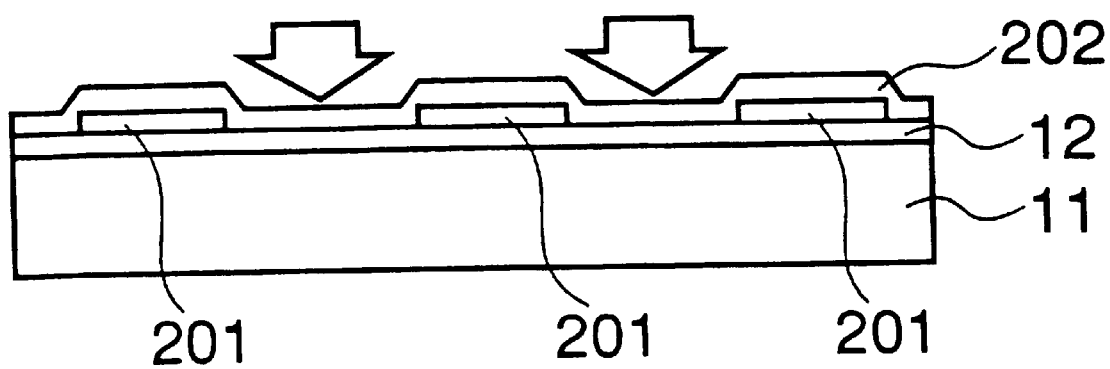
FIG. 21 illustrates a method for forming a crystalline semiconductor thin film according to a tenth embodiment of the invention.

FIG. 21 shows a tenth embodiment of the method for forming a crystalline Si thin film according to the invention. The tenth embodiment of the invention will be described with reference to FIG. 21.

In the present embodiment, Si thin film patterns 201 in the form of islands including crystallized regions are first formed as in the ninth embodiment of the invention. A single crystal Si substrate whose principal plane is a {110}-plane is used.

Next, as shown in FIG. 21, a second amorphous Si thin film 202 is formed to a thickness of about 50 nm on the entire surface of an insulated substrate 11.

Thereafter, the second amorphous Si thin film 202 is crystallized by irradiating it with an energy beam.

In this case, radiation from a XeCl excimer laser is used as the energy beam. A laser beam with a pulse width of about 15 nsec. is radiated plural times (5 to 20 times). The laser energy is adjusted such that the second amorphous Si thin film 202 is instantaneously melted.

When the second amorphous Si thin film 202 is recrystallized after it is once melted, the laser beams crystallize the film such that it will have the same crystal plane and crystal orientation as those of the Si thin film patterns 201.

In the present embodiment, the Si thin film patterns 201 are oriented to a {110}-plane like the single crystal Si substrate. Since recrystallization occurs around the Si thin film patterns 201, the second amorphous Si thin film 202 becomes a crystalline thin film whose principal plane is also a {110}-plane in the entire region thereof. It has the same crystal orientation as that of the Si thin film patterns 201. Since the laser melts and crystallizes of the second amorphous Si thin film 202 instantaneously, the Si thin film patterns 201 are preferably at a small pitch. In the present embodiment, the Si thin film patterns 201 are in a size of about 2×2 $\mu m^2$ and at a pitch of about 4 $\mu m$, and the pitch of the Si thin film patterns 201 is preferably about 5 $\mu m$ or less.

In the present embodiment, crystallization can be caused by radiating laser beams selectively as indicated by the arrows in FIG. 21. For example, control can be carried out such that crystallization with a controlled crystal plane and crystal orientation is caused only in regions where TFTs are to be formed or regions where TFTs having high mobility are required. Therefore, there is an advantage in that the processing time for even a large substrate can be significantly reduced through localized crystallization. There is another advantage in that a finally formed crystalline Si thin film is unlikely to be contaminated at a step of forming seed crystals similarly to the ninth embodiment.

While the Si thin film patterns 201 including the crystallized regions 16 are patterned in the present embodiment, such patterning is not essential. Specifically, a preparation is made in which an amorphous region is provided on the entire surface of the insulated substrate 11 and is crystallized as a whole with similar crystal planes and in which a second amorphous Si thin film 202 is formed thereon. Then, a laser beam may be projected upon the same to form a crystalline thin film on the entire surface.

Figure 22:
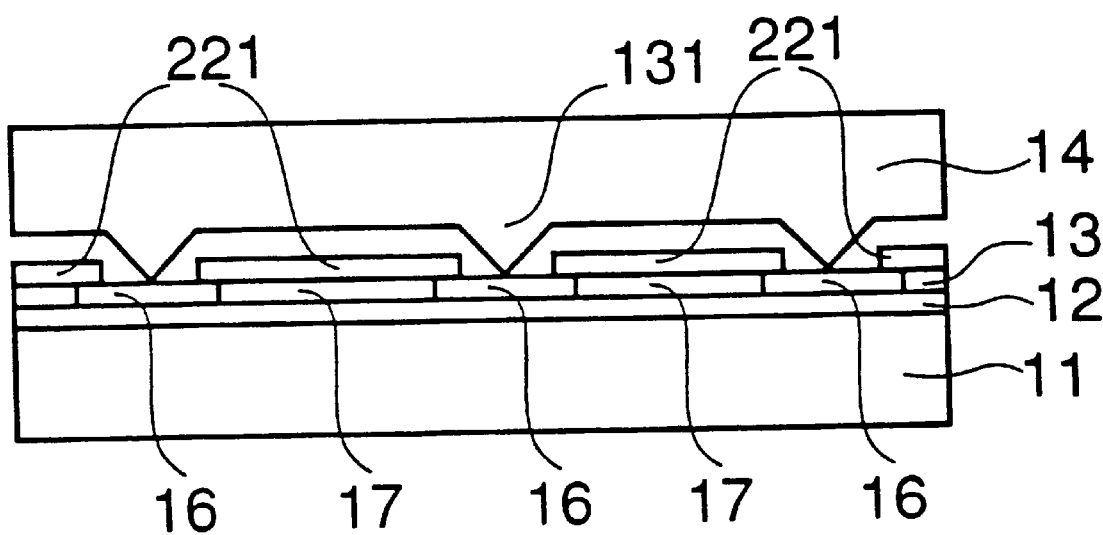
FIG. 22 illustrates a method for forming a crystalline semiconductor thin film according to an eleventh embodiment of the invention.

FIG. 22 shows an eleventh embodiment of the method for forming a crystalline Si thin film according to the invention. The eleventh embodiment will be described with reference to FIG. 22.

In the present embodiment, a protective film such as an oxide film or nitride film having holes in part thereof is formed on the surface of an amorphous Si thin film 13, and projections 131 on a single crystal Si substrate 14 are put into contact with the surface of the amorphous Si thin film 13 through such holes.

First, as shown in FIG. 22, an insulation layer 22 made of SiO$_2$ having a thickness of about 100 nm is formed on an insulated substrate 11 made of, for example, glass; an amorphous Si thin film 13 having a thickness of about 100 nm is formed thereon; and an insulation film 221 is formed thereon. The insulation film 221 of the present embodiment is provided by forming a SiO$_2$ film having a thickness of about 50 nm on the amorphous Si thin film 13 using a plasma CVD process and by continuously forming a SiN film having a thickness of about 50 nm using a plasma CVD process similarly.

Next, the insulation film 221 is etched to form a pattern which provides holes to expose the amorphous Si thin film 13 locally. In the present embodiment, holes in a size of about 3×3 $\mu$m$^2$ and at a pitch of about 20 $\mu$m are formed to expose the amorphous Si thin film 13.

Next, a single crystal Si substrate 14 having projections 131 and including Ni atoms on the surface thereof is formed using the same material and method as those in the fourth embodiment.

The projections 131 are aligned with the holes on the amorphous Si thin film 13, and a first thermal processing step is performed in a N$_2$ atmosphere at about 50° C. for about 1 hour. As a result, crystallized regions 16 are formed in part of the amorphous Si thin film 13.

Thereafter, the thin film and substrate are separated, and the amorphous Si thin film 13 is subjected to a second thermal processing step at about 550° C. for about 6 hours. This crystallizes the amorphous Si thin film 13 as a whole.

At this time, since most of the amorphous Si thin film 13 is covered by the insulation film 221, entry of impurities into the amorphous Si thin film 13 can be prevented. It is therefore possible to reduce crystal defects attributable to impurities at the thermal processing step significantly.

Specifically, since the amorphous Si thin film 13 is in contact with only the projections on the single crystal Si substrate 14, it is possible to prevent impurities from entering the amorphous Si thin film 13 during thermal processing, thereby providing a film in preferable quality with less crystal defects.

Figure 23:
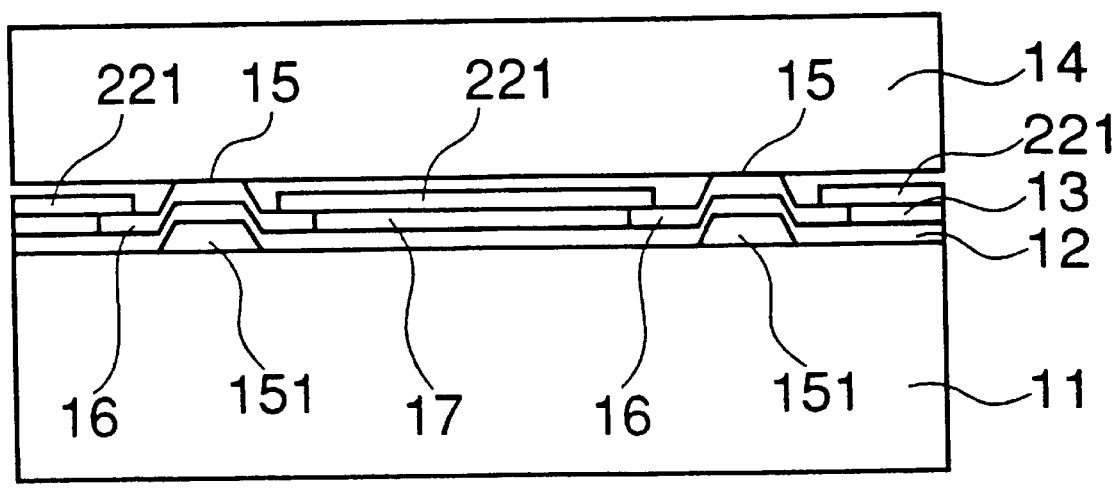
FIG. 23 illustrates a method for forming a crystalline semiconductor thin film according to a first modification of the eleventh embodiment of the invention.

FIG. 23 shows a first modification of the present embodiment.

Similarly to the sixth embodiment, convex patterns 151 are provided on an insulated substrate 11, and an insulation layer 12 and an amorphous Si thin film 13 are thereafter formed. A protective film such as an oxide film or nitride film is formed on the surface of the amorphous Si thin film 13 excluding regions corresponding to the convex patterns 151.

Crystallization is caused by putting the exposed convex patterns 151 into contact with the single crystal Si substrate 14.

In this modification, convex patterns 151 in a size of about 3×3 $\mu$m$^2$ and at a pitch of about 20 $\mu$m are formed using the same material and method as those in the sixth embodiment. Next, an insulation layer 12 and an amorphous Si thin film 13 are formed on the entire surface. An insulation film 221 having holes in a size of about 5×5 $\mu$m$^2$ is thereafter formed.

Next, a single crystal Si substrate 14 doped with Ni atoms is put into contact with the amorphous Si thin film 13 at contacts 15 similarly to the sixth embodiment, and a first thermal processing step is then performed. This crystallizes the amorphous Si thin film 13 to form crystallized regions 16.

The thin film and substrate are thereafter separated.

Then, the amorphous Si thin film 13 is subjected to a second thermal processing step at which it is kept for about 6 hours at about 550° C. As a result, the amorphous Si thin film 13 is crystallized as a whole.

In this embodiment, the amorphous Si thin film 13 contacts the single crystal Si substrate 14 at the contacts 15 thereof. This eliminates the need for precise alignment between the thin film and the substrate when they are put in contact with each other. Further, since most regions of the amorphous Si thin film 13 are covered by the insulation film 221, it is possible to prevent impurities from entering, thereby providing a preferable crystalline Si thin film.

Figure 24:
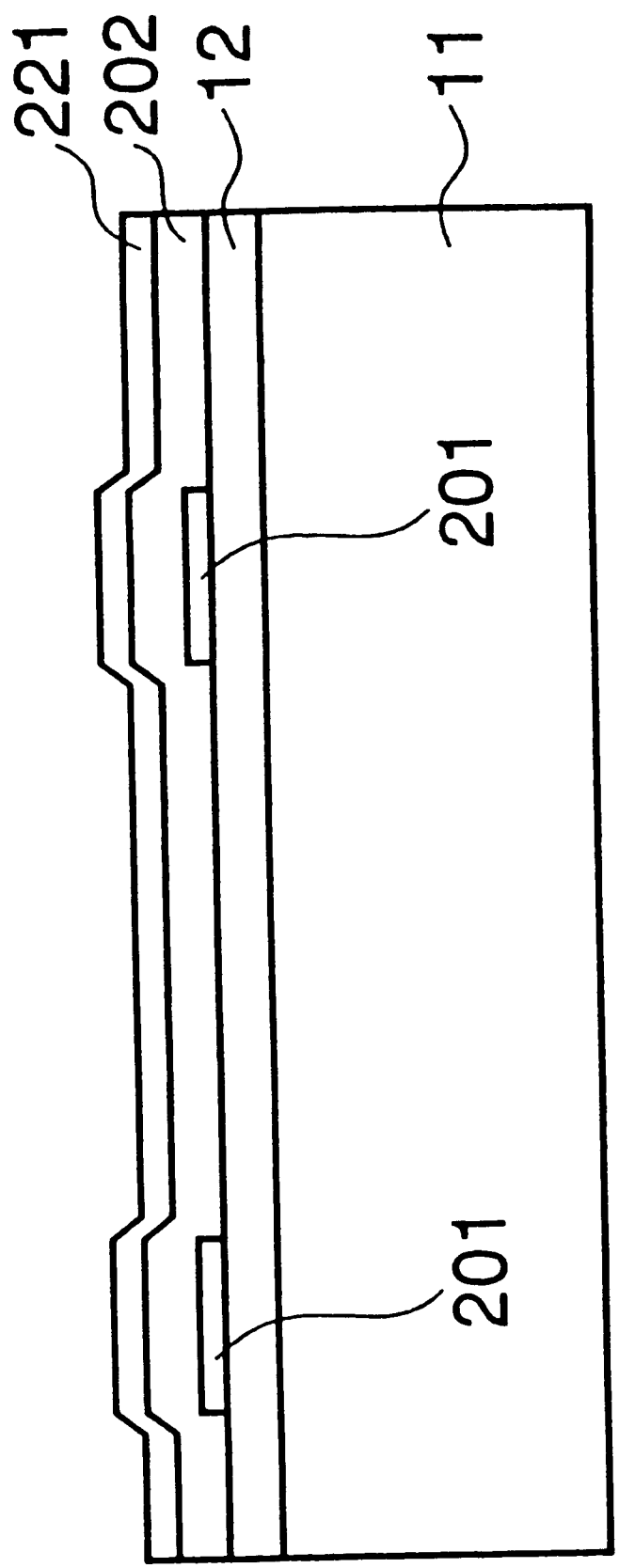
FIG. 24 illustrates a method for forming a crystalline semiconductor thin film according to a second modification of the eleventh embodiment of the invention.

FIG. 24 shows a second modification of the present embodiment.

An insulation film 12 is formed on an insulated substrate 11 similarly to the ninth embodiment. Si thin patterns 201 in the form of islands including crystallized regions are formed on the same, and a second amorphous Si thin film 202 is formed on the same. The second amorphous Si thin film 202 is then crystallized. However, the present modification is different from the ninth embodiment in that the second amorphous Si thin film 202 is crystallized after an insulation film 221 is formed on the second amorphous Si thin film 202.

First, the steps up to the formation of Si thin film patterns 201 in the form of islands including crystallized regions are performed using the same material and method as those in the ninth embodiment. Specifically, amorphous Si thin film patterns are put into contact with a single crystal Si substrate to form Si thin film patterns 201 having the same plane orientation as that of the single crystal Si substrate from the amorphous Si thin film patterns. Thereafter, a second amorphous Si thin film 202 having a thickness of about 100 nm is formed on the entire surface of the insulation layer 12 on which the Si thin film patterns 201 are formed. A SiO$_2$ film having a thickness of about 100 nm as an insulation film 221 and a SiN film having a thickness of about 50 nm are continuously formed on the same using a plasma CVD process.

Next, the second amorphous Si thin film 202 is subjected to a second thermal processing step in a N$_2$ atmosphere at about 500° C. for about 20 hours. This crystallizes the second amorphous Si thin film 202 as a whole. Since the crystal planes and crystal orientations of all of the Si thin film patterns 201 are the same as those of the single crystal Si substrate, the second amorphous Si thin film 202 becomes a crystalline thin film having a single crystal plane and crystal orientation. Further, since the thin film is entirely covered by the insulation film 221, it is possible to prevent impurities from entering the second amorphous Si thin film 202 at the second thermal processing step, thereby providing a preferable Si crystalline thin film with less crystal defects.

Figure 25:
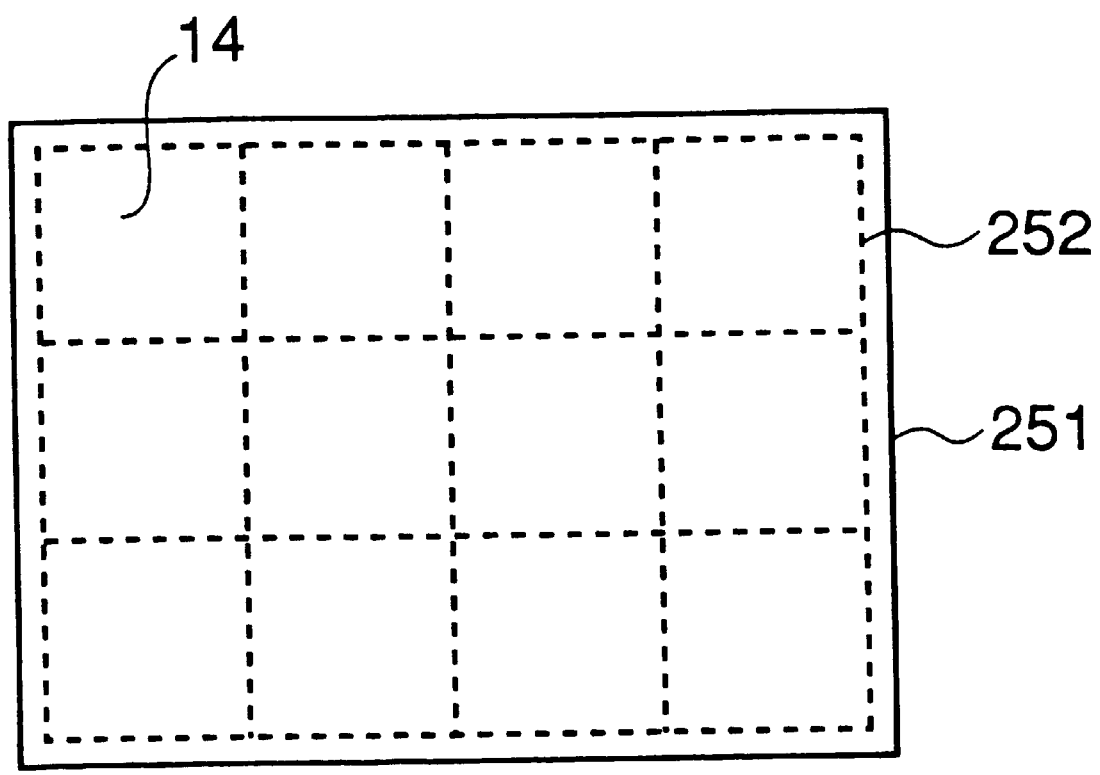
FIG. 25 illustrates a method for forming a crystalline semiconductor thin film according to a twelfth embodiment of the invention.

FIG. 25 shows a twelfth embodiment of the method for forming a crystalline Si thin film according to the invention. The twelfth embodiment of the invention will be described with reference to FIG. 25.

The present embodiment represents a method for forming a Si crystalline thin film on a large glass substrate.

First, single crystal Si substrates 14 in a size of about 90×90 mm$^2$ are arranged on a substrate holder 251. Each of the single crystal Si substrates 14 is doped with Ni atoms at least at the surface thereof similarly to the above-described embodiments. By arranging 3×4 sheets of such substrates as shown in FIG. 25, a single crystal Si substrate 252 having an effective area of about 270×360 mm$^2$ is obtained. The single crystal Si substrates 14 are provided with the same crystal plane and crystal orientation.

Next, the single crystal Si substrate 252 is put into contact with an amorphous Si thin film 13 in a size of about 300×400 mm$^2$ formed similarly to those in the above-described embodiments, and a thermal process is performed thereon to provide Si crystals with a large area.

One largest single crystal Si substrate 14 presently available has a size of only 8 inches, and the method of the present embodiment may be used to crystallize an amorphous Si thin film 13 with a size equal to or greater than the same.

Instead of using the method in the present embodiment, an amorphous Si thin film 13 with a large area may be crystallized by putting one single crystal Si substrate 14 into contact with the amorphous Si thin film 13 in several times at a first thermal processing step to form crystal nuclei. Thereafter, a second thermal processing step may be performed to crystallize the thin film as a whole.

Figure 26:
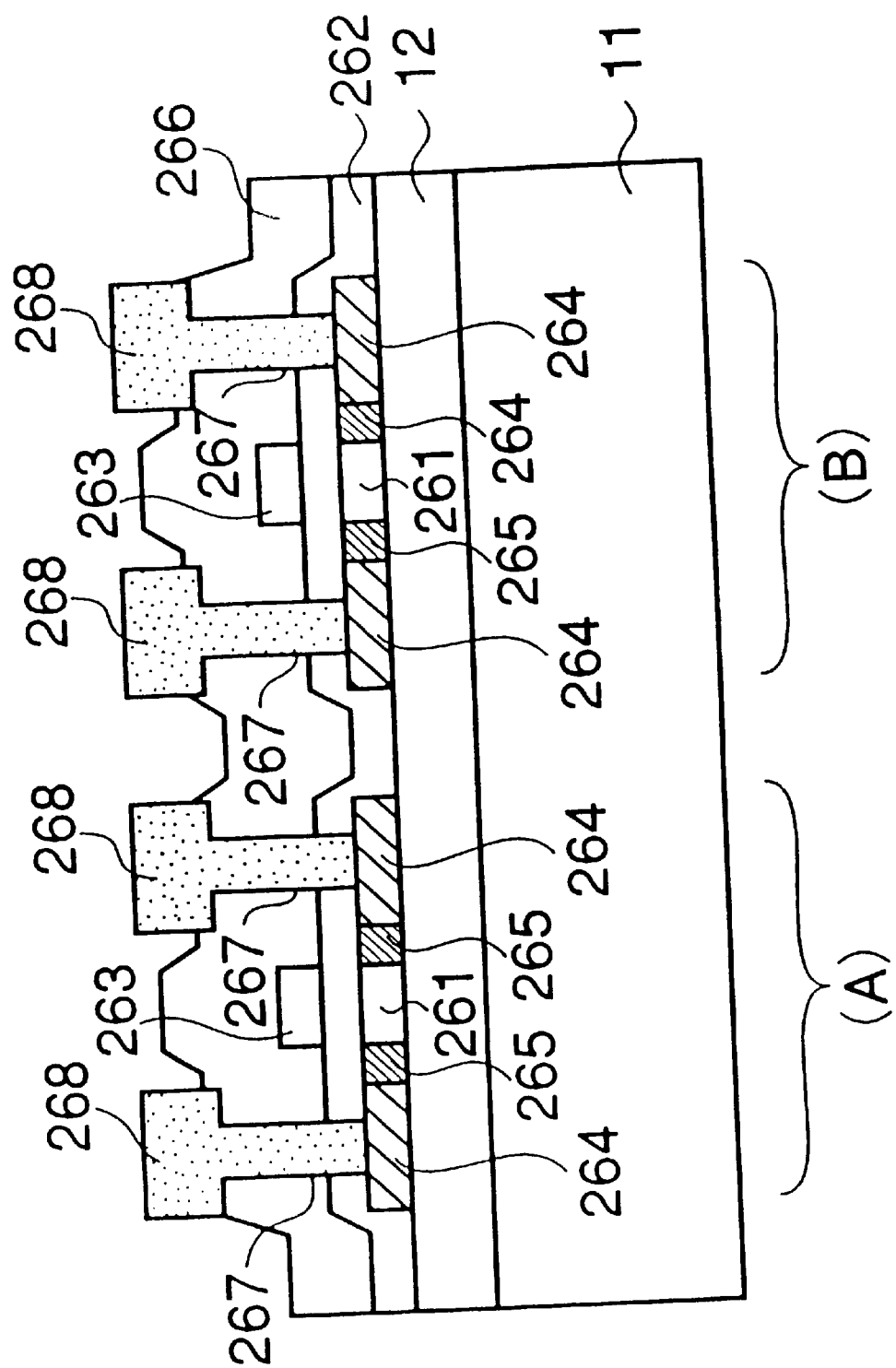
FIG. 26 illustrates a method for forming a crystalline semiconductor thin film according to a thirteenth embodiment of the invention.
Figure 27:
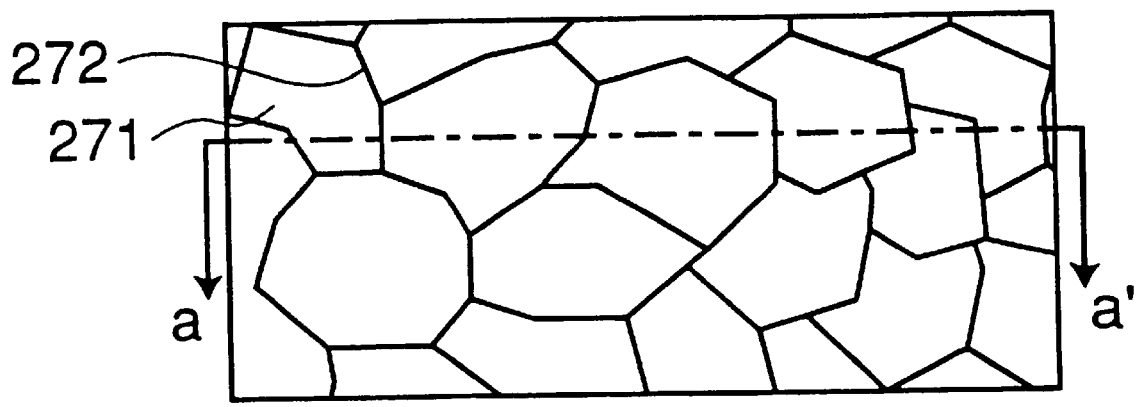
FIG. 27 illustrates a method for forming a crystalline semiconductor thin film according to the related art.
Figure 28:
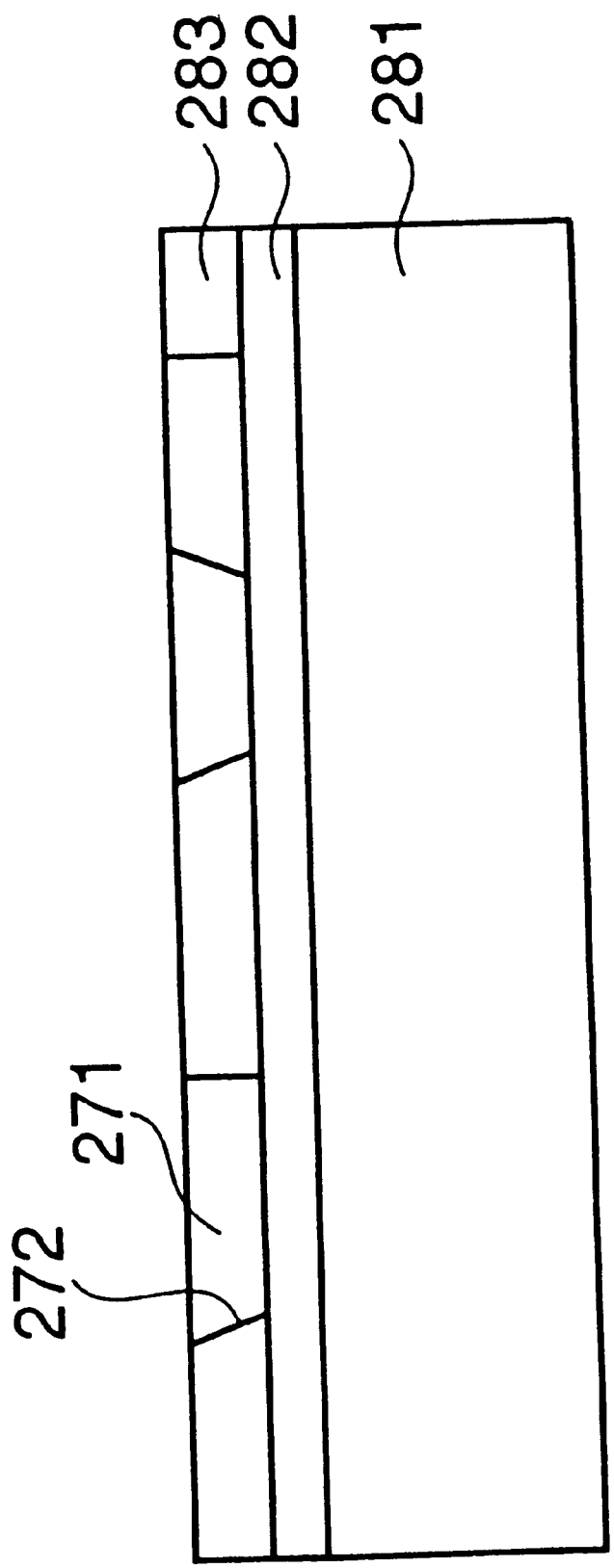
FIG. 28 illustrates the method for forming a crystalline semiconductor thin film according to the related art.
Figure 29:
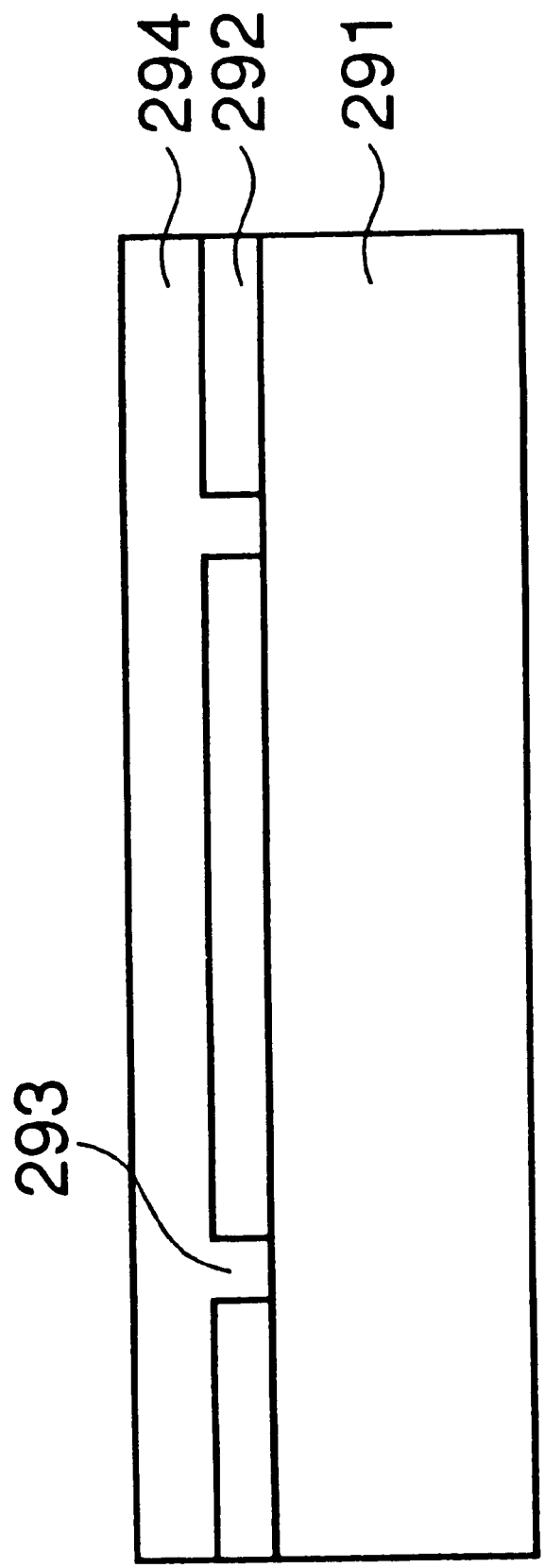
FIG. 29 illustrates the method for forming a crystalline semiconductor thin film according to the related art.

FIG. 26 shows an embodiment of the formation of TFTs utilizing a crystalline Si thin film according to the invention. The third embodiment of the invention will be described with reference to FIG. 26.

TFTs are incorporated as functional elements of a circuit in a manner that depends on the electronic apparatus of interest. For example, in a liquid crystal display, TFTs according to the present embodiment are formed in a matrix-like configuration as switching TFTs for respective pixels in a display portion. Driving circuit for driving the switching TFTs are formed, basically as CMOS circuits, outside the display area. Specifically, such driving circuits include a scan line driving circuit and a signal line driving circuit which are basically formed by a shift register, a level shifter, a latch circuit, a D-A converter, an analog buffer circuit, etc. The TFTs makes it possible to reduce operating voltages and to provide high performance analog circuits. Therefore, the use of the TFTs makes it possible to provide not only liquid crystal displays incorporating circuits with advanced functions but also reading/input apparatuses and printing apparatuses which must have a substrate with a large area or length.

First, an insulation layer 12 made of SiO$_2$ having a thickness of about 100 nm and an amorphous Si thin film having a thickness of about 50 nm are sequentially formed on an insulated substrate 11 made of, for example, glass, and crystallization is performed in the same manner as in any of the first through twelfth embodiments. The crystallized Si thin film is etched to be patterned in the form of islands, and only TFT regions 261 are left as shown in FIG. 26.

Next, a plasma CVD process is performed to form a gate oxide film 262 having a thickness of about 100 nm. A MoW alloy thin film having a thickness of about 300 nm is formed on the same, and a resist film is formed thereon. The resist film is then patterned, and the MoW alloy thin film exposed from the resist film is etched and removed. Thereafter, the resist film is peeled off to form gate electrodes 263.

Next, impurity atoms are implanted in part of the TFT regions 261 using a plasma doping process to form source and drain regions 264.

The source and drain regions of an n-channel TFT (A) may be formed by implanting P atoms at about 1×10$^{15}$ atoms/cm$^2$ using the gate electrode 263 as a mask. A mask constituted by a resist film is formed in advance on a p-channel TFT (B) adjacent thereto.

The source and drain regions of the p-channel TFT (B) may be formed by implanting B atoms at about 2×10$^{15}$ atoms/cm$^2$ using the gate electrode 263 of the p-channel TFT (B) as a mask. A mask constituted by a resist film may be formed in advance on the n-channel TFT (A).

When LDD regions 265 for moderating electric fields at the drains are provided as needed, P atoms and B atoms may be implanted in such regions of the n-channel TFT (A) and p-channel TFT (B), respectively. The doses may be set such that (a) they are smaller than the dose at the source and drain regions; (b) the resistance of the LDD regions is lower than the on-resistance of the channel regions; and (c) electric fields at the drains are moderated. For example, each dose is about 1×10$^{13}$ atoms/cm$^2$.

Thereafter, a thermal process is performed at about 500° C. for about 1 hour to recrystallize amorphous Si regions generated as a result of the implantation of the impurities.

Next, plasma CVD process is performed to form a SiO$_2$ film 266 having a thickness of about 500 nm on the entire surface.

A resist film is formed on the SiO$_2$ film 266, and the resist film is removed in locations where contacts with electrodes are to be provided. Thereafter, the exposed SiO$_2$ film 266 is etched to form contact holes 267. Then, Mo with a thickness of about 50 nm and Al with a thickness of about 500 nm are formed on the entire surface using a sputtering process and are etched and removed in regions other than regions where source and drain electrodes are to be provided. Thus, source and drain electrodes 268 are formed.

This completes the n-channel TFT (A) and the p-channel TFT (B).

According to the present embodiment, an amorphous Si thin film is crystallized while controlling the crystal planes and crystal orientations thereof using the above-described method. This makes it possible to limit the deviations between the plane orientations and crystal orientations of the crystalline thin film substantially to about 3° or less.

Carrier mobility which is characteristic of a TFT is sensitive to film quality of the TFT region 261. Especially, mobility is reduced as the deviation between the crystal orientations of adjoining crystal grains in the TFT region 261 increases. Such a reduction in mobility becomes significant when the deviation between the crystal orientations of adjoining crystal grains exceeds 5° and, in such a case, an obvious defective region can be observed at the grain boundary. The deviation between the crystal orientations of adjoining crystallized regions is desirably kept at about 5° or less or, more preferably, at about 3° or less from the viewpoint of the reduction in TFT carrier mobility. This makes it possible to limit a reduction of electron mobility to 30% or less.

Deviation between crystal orientations becomes significant when the crystallizing temperature is extremely low and when the intervals of contacts between a single crystal Si substrate and an amorphous Si thin film are large. Therefore, such conditions may be set such that desired TFT characteristics are achieved.

Another possible method for forming TFTs is to form TFTs by etching an amorphous Si thin film in the form of islands before crystallizing the amorphous Si thin film. Crystallization is performed with the TFT regions put in direct contact with a single crystal Si substrate as convex patterns. This makes it possible to reduce the number of processing steps. Further, since the area of the amorphous Si thin film to be subjected to a thermal process for crystallization is small, there is an advantage in that the time required for the thermal processing step for crystallization can be significantly reduced.

As described above in detail, the present invention makes it possible to turn an amorphous Si thin film formed on an insulated substrate into a single crystal. Further, since the crystal plane and crystal orientation of the thin film can be controlled using the single crystal Si substrate put into contact therewith, a desired crystal plane and crystal orientation can be achieved. The present invention provides high productivity because it can be implemented in simple thermal processing steps. In addition, high performance TFTs can be obtained to provide driving circuits capable of operating at a high speed. Furthermore, since defects in a Si thin film are reduced, it is possible to significantly improve non-uniformity of the threshold voltage of a TFT attributable to such defects.

The present invention is not limited to the above-described embodiments. For example, it is possible to use not only glass substrates but also metal substrates made of stainless steel and the like and insulated substrates such as ceramic substrates made of alumina and the like. It is preferable to form an amorphous Si thin film on any of such substrates after covering the same with an inorganic insulation film made of $SiO_2$, SiN or the like to prevent impurities from entering the substrate. The method for forming an amorphous Si thin film is not limited to the plasma CVD, and the film may be formed using thermal CVD processes such as low pressure CVD and normal pressure CVD, electron beam evaporation, sputtering and the like.

A very small amount of an impurity may be intentionally added to an amorphous Si thin film. This makes it possible to control the threshold voltage of a TFT.

The thermal processes associated with crystallization are not limited to a $N_2$ atmosphere, and they may be carried out in an inert gas atmosphere or vacuum. When an exposed surface of a Si thin film is crystallized, it is preferable to keep the concentration of oxygen in the atmosphere as low as possible.

While only single crystal Si substrates and amorphous Si thin films have been described in the above described embodiments, semiconductors such as Ge and Te may be used instead of Si.

As described above, the present invention makes it possible to form a Si crystalline thin film having excellent crystal orientation on an insulated substrate. The use of such a Si crystalline thin film makes it possible to improve the mobility of a TFT formed utilizing the same and to control the threshold voltage of the TFT.

Obviously, numerous modifications and variations of the present invention are possible in light of the above teachings. It is therefore to be understood that within the scope of the appended claims, the invention may be practiced otherwise than as specifically described herein.

The entire contents of each of the above-identified references, patents, applications and published applications are hereby incorporated by reference, the same as if set forth at length.

This application is based on Japanese patent application P11-277459, filed Sep. 29, 1999, the entire contents of which are hereby incorporated by reference, the same as if set forth at length.

What is claimed is:

1. A method for manufacturing a semiconductor thin film, comprising:
   preparing a single crystal semiconductor substrate, said single crystal semiconductor substrate comprising at least one catalytic metal on a surface thereof;
   forming a non-crystalline semiconductor thin film on a second substrate, wherein each of said non-crystalline semiconductor thin film and said single crystal semiconductor substrate comprises the same semiconductor element;
   touching said surface of said single crystal semiconductor substrate to said non-crystalline semiconductor thin film at a convex portion; and
   crystallizing said non-crystalline semiconductor thin film at a temperature between 400 and 600 degrees centigrade.

2. The method for manufacturing a semiconductor thin film according to claim 1, wherein said non-crystalline semiconductor thin film is an amorphous semiconductor layer.

3. The method for manufacturing a semiconductor thin film according to claim 1, wherein said catalytic metal is selected from a group consisting of Ni, Co, Au, Pd, Cu, Fe, and mixtures thereof.

4. The method for manufacturing a semiconductor thin film according to claim 1, wherein, during said crystallizing, substantially all of said non-crystalline semiconductor thin film is changed to a poly-crystalline semiconductor thin film comprising a plurality of crystal planes having, wherein the deviation between the crystal orientations of adjoining crystal planes is 5° or less.

5. The method for manufacturing a semiconductor thin film according to claim 1, wherein said semiconductor element is selected from the group consisting of Si, Ge, Te, and mixtures thereof.

6. The method for manufacturing a semiconductor thin film according to claim 1, wherein said single crystal semiconductor substrate comprises a {100}-crystal plane or a {110}-crystal plane on said surface.

7. The method for manufacturing a semiconductor thin film according to claim 1, further comprising: obtaining a poly-crystalline semiconductor thin film poly-crystalline
   detaching said single crystal semiconductor substrate from said semiconductor thin film; and
   heating said poly-crystalline semiconductor thin film at a temperature higher than said crystallizing temperature.

8. The method for manufacturing a semiconductor thin film according to claim 1, wherein said single crystal semiconductor substrate comprises at least one periodic portion comprising said catalytic metal on said surface.

9. The method for manufacturing a semiconductor thin film according to claim 1, further comprising:
   before said touching, discharging hydrogen in said non-crystalline semiconductor thin film.

10. The method for manufacturing a semiconductor thin film according to claim 1, wherein said convex portion comprises at least one protuberance on said surface of said single crystal semiconductor substrate.

11. The method for manufacturing a semiconductor thin film according to claim 1, wherein said convex portion comprises a plurality of periodic protuberances on said surface of single crystal semiconductor substrate.

12. The method for manufacturing a semiconductor thin film according to claim 1, wherein said convex portion is comprised on said surface of said single crystal semiconductor substrate which is round in shape.

13. The method for manufacturing a semiconductor thin film transistor according to claim 1, wherein said convex portion is a microscopic irregularity on said non-crystalline semiconductor thin film.

14. The method for manufacturing a semiconductor thin film according to claim 1, wherein said convex portion is a convex pattern on said single crystal semiconductor substrate.

15. A method for manufacturing a semiconductor thin film, comprising:
- preparing a single crystal semiconductor substrate, said single crystal semiconductor substrate comprising at least one catalytic metal on a surface thereof;
- forming a non-crystalline semiconductor thin film on a second substrate, wherein each of said non-crystalline semiconductor thin film and said single crystal semiconductor substrate comprises the same semiconductor element;
- touching said surface of said single crystal semiconductor substrate to said non-crystalline semiconductor thin film at a convex portion; and
- crystallizing said non-crystalline semiconductor thin film by low temperature solid state epitaxy.

16. The method for manufacturing a semiconductor thin film according to claim 15, wherein said semiconductor element is selected from the group consisting of Si, Ge, Te, and mixtures thereof.

17. A method for manufacturing a semiconductor thin film, the method comprising:
- preparing a single crystal semiconductor substrate, said single crystal semiconductor substrate comprising at least one catalytic metal on a surface thereof;
- forming a non-crystalline semiconductor thin film on a second substrate, wherein each of said non-crystalline semiconductor thin film and said single crystal semiconductor substrate comprises the same semiconductor element;
- touching said surface of said single crystal semiconductor substrate to said non-crystalline semiconductor thin film at a convex portion; and
- crystallizing said non-crystalline semiconductor thin film to obtain a poly-crystalline semiconductor thin film; wherein
  - after said crystallizing, said poly-crystalline semiconductor thin film comprises a deviation between crystal orientations of adjoining crystallized regions of less than 5 degrees.

18. The method for manufacturing a semiconductor thin film according to claim 17, wherein said semiconductor element is selected from the group consisting of Si, Ge, Te, and mixtures thereof.

19. A method for manufacturing a semiconductor thin film, the method comprising:
- preparing a single crystal semiconductor substrate, said single crystal semiconductor substrate comprising at least one catalytic metal on a surface thereof;
- forming a non-crystalline semiconductor thin film on a second substrate, wherein each of said non-crystalline semiconductor thin film and said single crystal semiconductor substrate comprises the same semiconductor element;
- touching said surface of said single crystal semiconductor substrate to said non-crystalline semiconductor thin film at a convex portion, said non-crystalline semiconductor thin film comprising a larger area than said surface of said single crystal semiconductor substrate; and
- crystallizing said non-crystalline semiconductor thin film at a temperature between 400 and 600 degrees centigrade.

20. The method for manufacturing a semiconductor thin film according to claim 19, wherein said touching is carried out more than once.

21. The method for manufacturing a semiconductor thin film according to claim 19, wherein said touching comprises touching a plurality of said single crystal semiconductor substrates.

22. The method for manufacturing a semiconductor thin film according to claim 19, wherein said semiconductor element is selected from the group consisting of Si, Ge, Te, and mixtures thereof.

23. A method for manufacturing a semiconductor thin film transistor comprising a channel, a gate, a source and a drain, the method comprising:
- preparing a single crystal semiconductor substrate, said single crystal semiconductor substrate comprising at least one catalytic metal on a surface thereof;
- forming a non-crystalline semiconductor thin film on a second substrate, wherein each of said non-crystalline semiconductor thin film and said single crystal semiconductor substrate comprises the same semiconductor element;
- touching said surface of said single crystal semiconductor substrate to said non-crystalline semiconductor thin film at a convex portion;
- crystallizing said non-crystalline semiconductor thin film at a temperature between 400 and 600 degrees centigrade, to obtain a poly-crystalline semiconductor thin film; and
- patterning said poly-crystalline semiconductor thin film for said channel.

24. The method for manufacturing a semiconductor thin film transistor according to claim 23, wherein said patterning is carried out after said crystallizing.

25. The method for manufacturing a semiconductor thin film transistor according to claim 23, wherein said patterning is carried out before said touching.

26. The method for manufacturing a semiconductor thin film transistor according to claim 23, wherein a portion of said semiconductor thin film touched to said single crystal semiconductor substrate in said touching remains in said patterning.

27. The method for manufacturing a semiconductor thin film according to claim 23, wherein said semiconductor element is selected from the group consisting of Si, Ge, Te, and mixtures thereof.

* * * * *